(12) United States Patent
Higuchi et al.

(10) Patent No.: US 12,356,773 B2
(45) Date of Patent: Jul. 8, 2025

(54) WAVELENGTH CONVERSION MEMBER, LIGHT EMITTING DEVICE, AND METHOD FOR PRODUCING WAVELENGTH CONVERSION MEMBER

(71) Applicant: NICHIA CORPORATION, Anan (JP)

(72) Inventors: Yu Higuchi, Anan (JP); Masafumi Kuramoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 220 days.

(21) Appl. No.: 17/645,790

(22) Filed: Dec. 23, 2021

(65) Prior Publication Data

US 2022/0209076 A1 Jun. 30, 2022

(30) Foreign Application Priority Data

Dec. 25, 2020 (JP) ................. 2020-217168

(51) Int. Cl.
*H10H 20/851* (2025.01)

(52) U.S. Cl.
CPC .............................. *H10H 20/8513* (2025.01)

(58) Field of Classification Search
None
See application file for complete search history.

(56) References Cited

U.S. PATENT DOCUMENTS

| | | | |
|---|---|---|---|
| 10,096,751 B2 | 10/2018 | Ikeda et al. | |
| 10,158,054 B1 | 12/2018 | Lin et al. | |
| 10,436,973 B2 | 10/2019 | Wang et al. | |
| 10,734,555 B2 | 8/2020 | Ikeda et al. | |
| 10,816,716 B2 | 10/2020 | Wang et al. | |
| 11,038,089 B2 | 6/2021 | Ikeda et al. | |
| 2017/0153382 A1 | 6/2017 | Wang et al. | |
| 2017/0155020 A1* | 6/2017 | Lin | H01L 33/60 |
| 2017/0294561 A1 | 10/2017 | Ikeda et al. | |
| 2018/0090709 A1* | 3/2018 | Meng | H10K 50/171 |

(Continued)

FOREIGN PATENT DOCUMENTS

| | | |
|---|---|---|
| CN | 111610587 A | 9/2020 |
| CN | 111668371 A | 9/2020 |

(Continued)

*Primary Examiner* — Sarah K Salerno
(74) *Attorney, Agent, or Firm* — Hunton Andrews Kurth LLP

(57) ABSTRACT

A wavelength conversion member containing a fluorescent material having, for example, a perovskite-type structure maintained with high light emission intensity; a light emitting device; and a method for producing a wavelength conversion member. The wavelength conversion member includes a translucent member containing a resin, a wavelength conversion layer containing a fluorescent material having, for example, a perovskite-type structure, and a composition of $ABX_3$, and a first intermediate layer between the translucent member and the wavelength conversion layer. The method for producing a wavelength conversion member includes forming a first intermediate layer on a surface of a first translucent member containing a resin, and forming a first wavelength conversion layer containing a first fluorescent material having, for example, a perovskite-type structure on a surface of the first intermediate layer.

16 Claims, 25 Drawing Sheets

(56) References Cited

U.S. PATENT DOCUMENTS

| | | |
|---|---|---|
| 2019/0035984 A1 | 1/2019 | Ikeda et al. |
| 2019/0221721 A1 | 7/2019 | Tang et al. |
| 2019/0383990 A1 | 12/2019 | Wang et al. |
| 2020/0243732 A1 | 7/2020 | Naito et al. |
| 2020/0303599 A1 | 9/2020 | Ikeda et al. |

FOREIGN PATENT DOCUMENTS

| | | |
|---|---|---|
| JP | 2017108129 A | 6/2017 |
| JP | 2017119907 A | 7/2017 |
| JP | 2017142486 A | 8/2017 |
| JP | 2017188592 A | 10/2017 |
| JP | 2019021890 A | 2/2019 |
| JP | 2019061230 A | 4/2019 |
| JP | 2019534543 A | 11/2019 |
| KR | 20200094948 A | 8/2020 |
| WO | 2019022194 A1 | 1/2019 |

\* cited by examiner

WAVELENGTH CONVERSION MEMBER, LIGHT EMITTING DEVICE, AND METHOD FOR PRODUCING WAVELENGTH CONVERSION MEMBER

CROSS-REFERENCE TO RELATED PATENT APPLICATION

This application claims priority to Japanese Patent Application No. 2020-217168, filed on Dec. 25, 2020, the disclosure of which is hereby incorporated reference in its entirety.

BACKGROUND

Technical Field

The present disclosure relates to a wavelength conversion member, a light emitting device, and a method for producing a wavelength conversion member.

Description of Related Art

Light emitting devices using light emitting elements such as a light emitting diode (LED) and a laser diode (LD) are light sources having high conversion efficiency and are used in a wide range of fields, including light emitting devices for automotive and interior lighting, backlight light sources for image display devices using liquid crystals, illuminations, and light source devices for projectors.

As for fluorescent materials used in light emitting devices, there is increasing interest in compounds having a perovskite-type structure as fluorescent materials having a narrow full width at half maximum of the light emission spectrum and excellent color purity. For example, International Unexamined Patent Publication No. 2019/022194 discloses a composition containing: a compound having a perovskite-type structure; at least one compound selected from the group consisting of inorganic particles, a solvent, a polymerizable compound, ammonia, an amine, and a carboxylic acid; and a silazane or a modified product thereof, in order to form fluorescent material films used in light emitting devices. In this specification, the "fluorescent material" is used in the same meaning as a "fluorescent phosphor".

Fluorescent materials having a perovskite-type structure are required to be further improved in order to maintain the light emission intensity.

Accordingly, exemplary aspects of the present disclosure are to provide a wavelength conversion member containing a fluorescent material having a perovskite-type structure maintained with high light emission intensity, a light emitting device, and a method for producing a wavelength conversion member.

SUMMARY

A first aspect of the present disclosure relates to a wavelength conversion member including a translucent member containing a resin, a wavelength conversion layer containing a first fluorescent material having a composition of $ABX_3$, and a first intermediate layer between the translucent member and the wavelength conversion layer, wherein in $ABX_3$, A represents at least one cation selected from the group consisting of $Rb^+$, $CH_3NH_3^+$, and $Cs^+$, B represents at least one metal ion selected from the group consisting of $Pb^{2+}$ and $Sn^{2+}$, and X represents at least one anion selected from the group consisting of $F^-$, $Cl^-$, $Br^-$, and $I^-$. The first fluorescent material may have a perovskite-type structure.

A second aspect of the present disclosure relates to a light emitting device including the wavelength conversion member and an excitation light source.

A third aspect of the present disclosure relates to a method for producing a wavelength conversion member including forming a first intermediate layer on a surface of a first translucent member containing a resin, forming a first wavelength conversion layer containing a first fluorescent material having a composition of $ABX_3$ on a surface of the first intermediate layer, forming a second intermediate layer on a surface of the first wavelength conversion layer, and forming a second wavelength conversion layer containing a second fluorescent material having a light emission peak wavelength in a wavelength range different from that of the first fluorescent material on a surface of the second intermediate layer, wherein in $ABX_3$, A represents at least one cation selected from the group consisting of $Rb^+$, $CH_3NH_3^+$, and $Cs^+$, B represents at least one metal ion selected from the group consisting of $Pb^{2+}$ and $Sn^{2+}$, and X represents at least one anion selected from the group consisting of $F^-$, $Cl^-$, $Br^-$, and $I^-$. The first fluorescent material may have a perovskite-type structure.

In accordance with certain exemplary aspects of the present disclosure, a wavelength conversion member containing a fluorescent material having a perovskite-type structure and a composition of $ABX_3$, maintained with high light emission intensity, a light emitting device, and a method for producing a wavelength conversion member, can be provided.

DETAILED DESCRIPTION

The wavelength conversion member and the light emitting device according to the present disclosure will be hereunder described on the basis of embodiments. The embodiments described below are exemplifications for embodying the technical idea of the present disclosure, and the present disclosure is not limited to the following wavelength conversion member, the light emitting device, and the method for producing a wavelength conversion member. The relationships between color names and chromaticity coordinates, and the relationships between wavelength ranges of light and color names of monochromic light are in accordance with Japanese Industrial Standard (JIS) Z8110. In the present specification, terms such as "sheet", "film", and "layer" are not distinguished from each other based only on the difference in designation. Thus, for example, "film" is used to include a member that may also be called a sheet, and "sheet" is used to include a member that may also be called a film.

Figure 1:
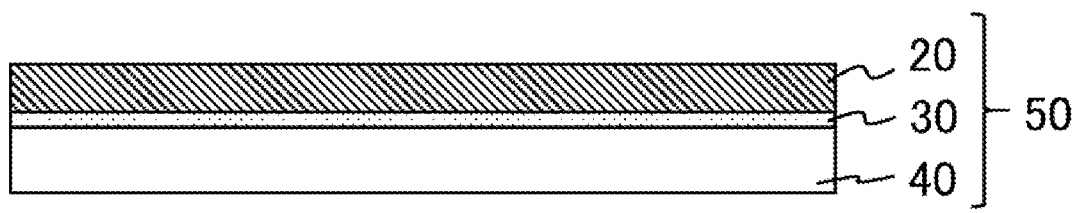
FIG. 1 is a schematic cross-sectional view showing a structure of an exemplary wavelength conversion member according to a first embodiment.

A wavelength conversion member according to a first embodiment will be described with reference to the drawings. FIG. 1 is a schematic cross-sectional view showing a schematic configuration of the wavelength conversion member according to the first embodiment. The wavelength conversion member 50 includes a translucent member 40 containing a resin, a wavelength conversion layer 20 containing a fluorescent material having a perovskite-type structure, and a first intermediate layer 30 provided between the translucent member 40 and the wavelength conversion layer 20. However, in each figure, the size and thickness of each layer are merely examples and are exaggerated for convenience of explanation.

Examples of the fluorescent material having a perovskite-type structure include a fluorescent material having an $ABX_3$-type perovskite-type structure. In the perovskite-type structure, A represents a component located at each vertex of a hexahedron centered on B, and is at least one cation selected from the group consisting of $Rb^+$, $CH_3NH_3^+$, and $Cs^+$. In the perovskite-type structure, B represents a component located at the center of a hexahedron with A at the vertex and an octahedron with X at the vertex, and is at least one metal ion selected from the group consisting of $Pb^{2+}$ and $Sn^{2+}$. In the perovskite-type structure, X represents a component located at each vertex of an octahedron centered on B, and is at least one anion selected from the group consisting of $F^-$, $Cl^-$, $Br^-$, and $I^-$.

The fluorescent material having a perovskite-type structure is preferably a cesium-lead halide. The halogen contained in the cesium-lead halide is preferably at least one selected from the group consisting of fluorine, chlorine, bromine, and iodine. When the halogen contained in the cesium-lead halide is at least one selected from the group consisting of fluorine, chlorine, bromine, and iodine, it is easy to obtain a fluorescent material that has a perovskite-type structure and emits light.

The fluorescent material having a perovskite-type structure may contain a cesium-lead halide having a composition represented by $CsPbBr_3$, and/or may contain a cesium-lead halide having a composition represented by $Cs_4PbBr_6$. The cesium-lead halide having a perovskite-type structure and a composition represented by $CsPbBr_3$ has high light absorption capacity, high light emission intensity, and vivid light emission color. In addition, the fluorescent material having a perovskite-type structure has a narrow full width at half maximum of the light emission peak in the light emission spectrum and good color purity, which improves color reproducibility when emitting mixed color light with light in other wavelength regions.

In the fluorescent material, the cesium-lead halide having a perovskite-type structure may contain two or more types of halogens. The cesium-lead halide having a perovskite-type structure may have a composition represented by the following formula (I):

$$CsPb(Br_{1-x}Ha^1{}_x)_3 \quad\quad (I)$$

wherein $Ha^1$ represents at least one selected from the group consisting of F, Cl, and I, and the parameter x satisfies $0 \le x < 1.0$.

The parameter x may satisfy $0.01 \le x \le 0.99$, may satisfy $0.02 \le x \le 0.98$, and may satisfy $0.03 \le x \le 0.95$.

$Cs_4PbBr_6$ contained in the fluorescent material is ideally a transparent crystal that does not emit light by irradiation with visible light. It is presumed that if a trace amount of impurities are present in the crystal having the composition represented by $Cs_4PbBr_6$ contained in the fluorescent material, the crystal may emit light by irradiation with visible light. It is also presumed that if there are no impurities in the crystal having the composition represented by $Cs_4PbBr_6$ and the crystal has the composition represented by pure $Cs_4PbBr_6$, that is, the crystal has the ideal composition represented by $Cs_4PbBr_6$, the crystal does not emit light by irradiation with visible light. For example, raw materials such as $CsBr$ and $PbBr_2$ can be vapor-deposited to form a complex of $CsPbBr_3$ and $Cs_4PbBr_6$. The formation of a complex containing $CsPbBr_3$ dispersed in a transparent matrix of $Cs_4PbBr_6$ stabilizes $CsPbBr_3$ and allows electrons and holes to be involved in light emission without migrating to agglomerated large particles, as is the case where $CsPbBr_3$ presents in agglomerate, thereby maintaining high light emission intensity.

When the fluorescent material is a cesium-lead halide, the fluorescent material preferably contains a cesium-lead halide having a composition represented by $CsPbBr_3$ in a range of 1% by mass or more and 50% by mass or less relative to the total amount of the fluorescent material. When the fluorescent material contains a cesium-lead halide having a composition represented by $CsPbBr_3$ in a range of 1% by mass or more and 50% by mass or less, a wavelength conversion member having high light emission intensity can be provided. The fluorescent material may contain a cesium-lead halide having a composition represented by $CsPbBr_3$ in a range of 2% by mass or more and 45% by mass or less, may contain in a range of 3% by mass or more and 40% by mass or less, and may contain in a range of 5% by mass or more and 35% by mass or less.

In the case where the fluorescent material contains a cesium-lead halide having a composition represented by $CsPbBr_3$, and the content of the cesium-lead halide having a composition represented by $CsPbBr_3$ falls within the range of 1% by mass or more and 50% by mass or less relative to the total amount of the fluorescent material, when excited by light having a light emission peak wavelength in a range of 380 nm or more and 500 nm or less, it is preferable to emit light having a light emission peak wavelength in a range of 500 nm or more and 610 nm or less, which is on the longer wavelength side than the excitation light. When the fluorescent material is excited by the light having a light emission peak wavelength in a range of 380 nm or more and 500 nm or less, the light emission peak wavelength of light emitted by the fluorescent material is more preferably in a range of more than 500 nm and 600 nm or less, even more preferably in a range of 510 nm or more and 570 nm or less, and still more preferably in a range of 520 nm or more and 560 nm or less.

When the fluorescent material contains a cesium-lead halide having a composition represented by $CsPbBr_3$, and the content of the cesium-lead halide having a composition represented by $CsPbBr_3$ falls within the range of 1% by mass or more and 50% by mass or less relative to the total amount of the fluorescent material, the full width at half maximum is preferably narrow in the light emission spectrum of the fluorescent material, and is preferably 35 nm or less, more preferably 30 nm or less, and even more preferably 25 nm or less. The full width at half maximum (FWHM) of the light emission peak in the light emission spectrum, and means a wavelength width of the light emission peak that indicates a value of 50% of the maximum value of the light emission peak in the light emission spectrum. A fluorescent material having a light emission peak with a narrow full width at half maximum has high color purity and good color reproducibility.

The wavelength conversion layer contains the above-mentioned fluorescent material having a perovskite-type structure and a composition of $ABX_3$. The wavelength conversion layer containing the above-mentioned fluorescent material having a perovskite-type structure and a composition of $ABX_3$ may be referred to as a first wavelength conversion layer. The wavelength conversion layer preferably contains 99% by mass or more of a cesium-lead halide, and may contain 99.5% by mass or more thereof, may contain 99.8% by mass or more thereof, and may contain 100% by mass or more thereof. When the wavelength conversion layer contains 99% by mass or more of a cesium-lead halide, high light emission intensity can be maintained.

The wavelength conversion layer preferably has a thickness in a range of 10 nm or more and 10 μm or less. When the thickness of the wavelength conversion layer falls within the range of 10 nm or more and 10 μm or less, a wavelength conversion member having high light emission intensity and satisfying the demand for miniaturization can be provided by the fluorescent material having a perovskite-type structure and a composition of $ABX_3$ contained in the wavelength conversion layer. The thickness of the wavelength conversion layer may be in a range of 20 nm or more and 5 μm or less, may be in a range of 30 nm or more and 3 μm or less, and may be in a range of 50 nm or more and 1 μm or less.

The first intermediate layer is arranged between the translucent member containing a resin and the wavelength conversion layer. The first intermediate layer preferably contains at least one oxide selected from the group consisting of silicon dioxide, aluminum oxide, zirconium oxide, magnesium oxide, titanium oxide, cerium oxide, zinc oxide, and tin oxide; and may contain two or more types of these. The first intermediate layer preferably contains a transparent inorganic oxide, and is more preferably composed of a transparent inorganic oxide. The first intermediate layer is preferably arranged on the entire surface of the translucent member containing a resin on the side of the wavelength conversion layer. The fluorescent material having a perovskite-type structure and a composition of $ABX_3$ contained in the wavelength conversion layer reacts with a resin contained in the translucent member due to heat when the excitation light source emits light, causing the crystal structure to change, and the light emission intensity tends to decrease. The presence of the first intermediate layer between the translucent member and the wavelength conversion layer suppresses the reaction between the fluorescent material having a perovskite-type structure and a composition of $ABX_3$ contained in the wavelength conversion layer, and the resin contained in the translucent member, thereby suppressing the decrease in the light emission intensity of the fluorescent material. The first intermediate layer in the wavelength conversion member according to the embodiment described below can use the same first intermediate layer as that in the wavelength conversion member according to the first embodiment.

A ratio of a thickness of the first intermediate layer to a thickness of the wavelength conversion layer may be in a range of 0.001 or more and 1,000 or less. When the ratio of the thickness of the first intermediate layer to the thickness of the wavelength conversion layer falls within the range of 0.001 or more and 1,000 or less, the reaction between the fluorescent material having a perovskite-type structure and a composition of $ABX_3$ contained in the wavelength conversion layer, and the resin contained in the translucent member can be suppressed, thereby suppressing the decrease in the light emission intensity of the fluorescent material. The ratio of a thickness of the first intermediate layer to a thickness of the wavelength conversion layer may be in a range of 0.005 or more and 500 or less, and may be in a range of 0.01 or more and 100 or less.

Specifically, the thickness of the first intermediate layer may be in a range of 0.1 nm or more and 10 μm or less, may be in a range of 0.5 nm or more and 1 μm or less, may be in a range of 1 nm or more and 500 nm or less, may be in a range of 3 nm or more and 300 nm or less, and may be in a range of 5 nm or more and 100 nm or less.

The translucent member contains a resin and also functions as a protective member for the wavelength conversion layer. The translucent member may be a single-layered member containing a resin, and may be a laminated member containing a plurality of different types of resins. The translucent member includes layers containing a plurality of different types of resins and may include a barrier layer formed of an inorganic oxide. The translucent member can use a commercially available optical film or protective film that is laminated with layers containing a plurality of different types of resins and includes a barrier layer formed of an inorganic oxide. When the translucent member is composed of layers containing a plurality of resins, for example, it may include functional layers having functions such as an adhesive layer for facilitating bonding the translucent member with other members, and an antistatic layer. The overall thickness of the translucent member is not particularly limited, but is preferably in a range of 5 µm or more and 500 µm or less, may be in a range of 10 µm or more and 450 µm or less, may be in a range of 15 µm or more and 400 µm or less, and may be in a range of 20 µm or more and 350 µm or less, in order to meet the requirements for strength and miniaturization.

Figure 2:
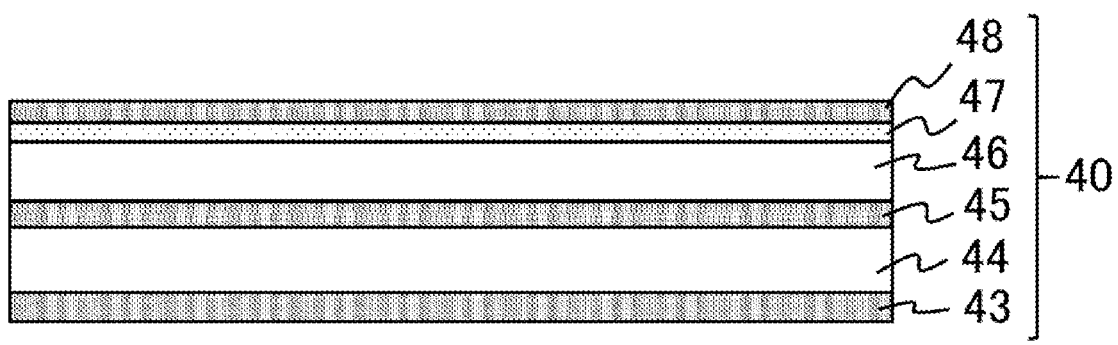
FIG. 2 is a schematic cross-sectional view showing a structure of an exemplary translucent member containing a resin.

FIG. 2 is a schematic cross-sectional view showing an example of a translucent member in which a plurality of different types of resin layers are laminated. The translucent member 40 may have a laminated structure in which, for example, a first bonding layer 43, a first protective layer 44, a second bonding layer 45, a second protective layer 46, a gas barrier layer or a water vapor barrier layer 47, and an antistatic layer or a third bonding layer 48 are laminated.

When the translucent member is a member in which a plurality of layers are laminated as shown in FIG. 2, examples of the resin constituting the first protective layer and the second protective layer include polyester-based resins.

The polyester-based resins constituting the first protective layer and the second protective layer may include a homopolyester and a copolymerized polyester. As the homopolyester, those obtained by polycondensing an aromatic dicarboxylic acid such as terephthalic acid or 2,6-naphthalenedicarboxylic acid with an aliphatic glycol are preferred. Typical examples of the polyester resin include polyethylene terephthalate (PET). Examples of the dicarboxylic acid component contained in the copolymerized polyester include one or two or more types of isophthalic acid, phthalic acid, terephthalic acid, 2,6-naphthalenedicarboxylic acid, adipic acid, and sebacic acid; and examples of the glycol component include one or two or more types of ethylene glycol, diethylene glycol, propylene glycol, butanediol, 4-cyclohexanedimethanol, and neopentyl glycol. Typical examples of the copolymerized polyester include polyethylene-2,6-naphthalenedicarboxylate (PEN).

The thickness of each of the first protective layer and the second protective layer is, for example, in a range of 5 µm or more and 400 µm or less, may be in a range of 10 µm or more and 350 µm or less, may be in a range of 20 µm or more and 300 µm or less, and may be in a range of 30 µm or more and 250 µm or less. The first protective layer and the second protective layer may have the same thickness or different thicknesses.

The acrylic resin or the like constituting the first bonding layer preferably contains a compound having a carbon-carbon double bond with functional groups such as a monofunctional (meth)acrylate group, a bifunctional (meth)acrylate group, a polyfunctional (meth)acrylate group, a vinyl group, and an allyl group. The notation of (meth)acrylate represents acrylate and/or methacrylate.

Examples of the polyisophthalic acid resin or the like constituting the second bonding layer include a resin composed of a polyvalent carboxylic acid and a polyvalent hydroxy compound. Examples of the polyvalent carboxylic acid include terephthalic acid, isophthalic acid, orthophthalic acid, and phthalic acid. Examples of the polyvalent hydroxy compound include ethylene glycol, 1,2-propylene glycol, 1,3-propylene glycol, 1,3-propanediol, 1,4-butanediol, and 1,6-hexanediol. One or more of each of these polyvalent carboxylic acids and polyvalent hydroxy compounds may be appropriately selected to synthesize a polyester resin by conventional polycondensation reaction.

The gas barrier layer or the water vapor barrier layer preferably contains at least one oxide selected from the group consisting of silicon dioxide, aluminum oxide, zirconium oxide, magnesium oxide, titanium oxide, cerium oxide, zinc oxide, and tin oxide; and may contain two or more types of these. The gas barrier layer or the water vapor barrier layer contained in the translucent member may contain the same oxide as the above-mentioned intermediate layer, or may contain a different oxide. The gas barrier layer or the water vapor barrier layer contained in the translucent member may be formed by a vapor deposition method such as a physical vapor deposition method (PVD) or a chemical vapor deposition method (CVD). The thickness of the gas barrier layer or the water vapor barrier layer contained in the translucent member is not particularly limited, but may be in a range of 0.1 nm or more and 500 nm or less, may be in a range of 1 nm or more and 300 nm or less, and may be in a range of 5 nm or more and 100 nm or less.

The antistatic layer may be composed of, for example, a layer containing polyimide. The third bonding layer may be composed of, for example, a layer containing a urethane-based resin. Examples of polyester polyols constituting the urethane-based resin include polyvalent carboxylic acids (such as malonic acid, succinic acid, glutaric acid, adipic acid, pimelic acid, suberic acid, sebacic acid, fumaric acid, maleic acid, terephthalic acid, and isophthalic acid) or their acid anhydrides, and polyhydric alcohols (such as ethylene glycol, diethylene glycol, triethylene glycol, propylene glycol, dipropylene glycol, tripropylene glycol, and butanediol). Examples of polyisocyanates constituting the urethane-based resin include tolylene diisocyanate, xylylene diisocyanate, methylene diphenyl diisocyanate, phenylene diisocyanate, and naphthalene diisocyanate.

The thickness of each of the first bonding layer, the second bonding layer, and the third bonding layer is in a range of 0.005 µm or more and 10 µm or less, may be in a range of 0.01 µm or more and 5 µm or less, and may be in a range of 0.05 µm or more and 2 µm or less. The first bonding layer, the second bonding layer, and the third bonding layer may have the same thickness or different thicknesses.

Figure 3:
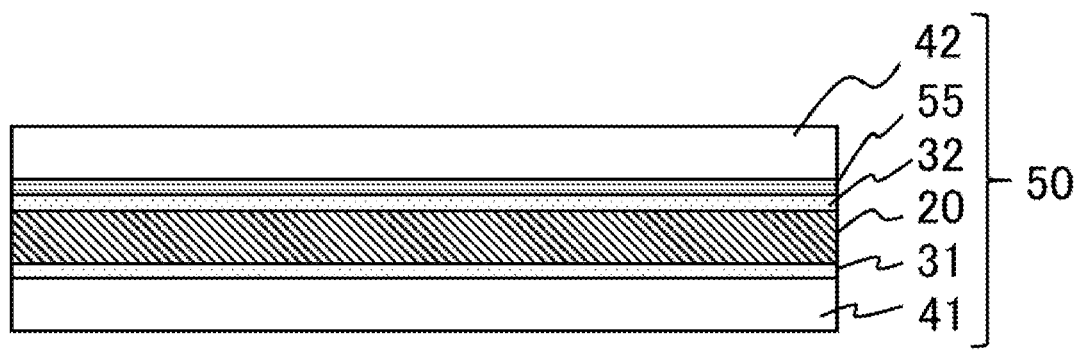
FIG. 3 is a schematic cross-sectional view of an exemplary wavelength conversion member according to a second embodiment.

Hereinafter, each embodiment will be described with reference to the drawings as necessary. FIG. 3 is a schematic cross-sectional view showing a schematic configuration of the wavelength conversion member according to the second embodiment. The wavelength conversion member 50 includes a first translucent member 41, a second translucent member 42, a wavelength conversion layer 20 arranged between the first translucent member 41 and the second translucent member 42, a first intermediate layer 31 arranged on the wavelength conversion layer 20 on the side of the first translucent member 41, a second intermediate layer 32 arranged on the wavelength conversion layer 20 on the side of the second translucent member 42, and a first adhesive layer 55 that bonds the second intermediate layer 32 with the second translucent member 42.

The first translucent member and the second translucent member can use the same translucent member as that in the wavelength conversion member according to the first embodiment. The thickness of each of the first translucent member and the second translucent member is preferably in a range of 5 µm or more and 500 µm or less, may be in a range of 10 µm or more and 450 µm or less, may be in a range of 15 µm or more and 400 µm or less, and may be in a range of 20 µm or more and 350 µm or less, in order to meet the requirements for strength and miniaturization. The first translucent member and the second translucent member in the wavelength conversion member according to the embodiment described below can use the same translucent member as those of the wavelength conversion member according to the second embodiment.

The second intermediate layer can use the same material as that of the first intermediate layer according to the first embodiment. The thickness of each of the first intermediate layer and the second intermediate layer is preferably in a range of 10 nm or more and 10 µm or less, may be in a range of 20 nm or more and 5 µm or less, may be in a range of 30 nm or more and 3 µm or less, and may be in a range of 50 nm or more and 1 µm or less, in order to suppress the decrease in the light emission intensity of the fluorescent material and meet the requirement for miniaturization. The ratio of a thickness of the first intermediate layer to a thickness of the wavelength conversion layer is preferably in a range of 0.01 or more and 1,000 or less, may be in a range of 0.05 or more and 500 or less, and may be in a range of 0.1 or more and 100 or less. The ratio of a thickness of the second intermediate layer to a thickness of the wavelength conversion layer is preferably in a range of 0.01 or more and 1,000 or less, may be in a range of 0.05 or more and 500 or less, and may be in a range of 0.1 or more and 100 or less.

The first adhesive layer preferably contains at least one resin selected from the group consisting of, for example, polyester resins, acrylic resins, acrylic urethane resins, polyester acrylate resins, polyurethane acrylate resins, epoxy acrylate resins, and urethane resins; and may contain two or more types of resins. The thickness of the first adhesive layer can be in a range of 0.005 µm or more and 10 µm or less.

Figure 4:
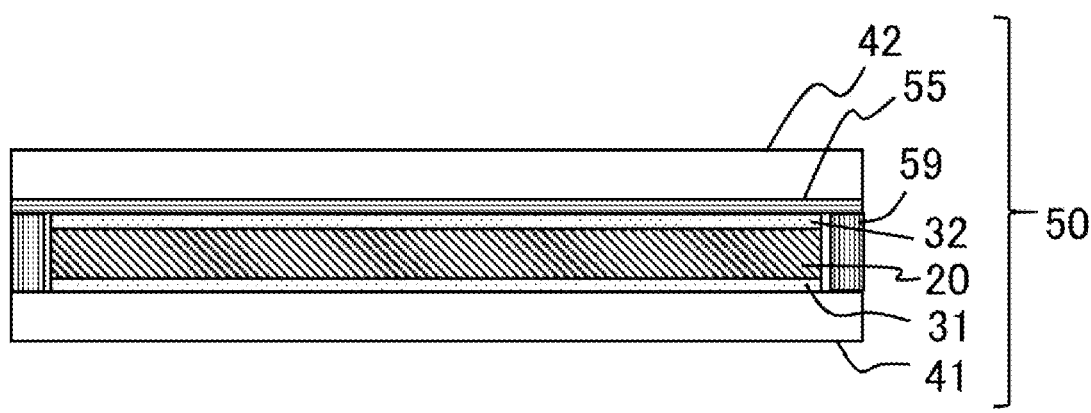
FIG. 4 is a schematic cross-sectional view of an exemplary wavelength conversion member according to a third embodiment.

FIG. 4 is a schematic cross-sectional view showing a schematic configuration of the wavelength conversion member according to the third embodiment. Similar to the wavelength conversion member 50 according to the second embodiment, the wavelength conversion member 50 according to the third embodiment includes a first translucent member 41, a second translucent member 42, a first intermediate layer 31 arranged between the first translucent member 41 and the second translucent member 42, a wavelength conversion layer 20, a second intermediate layer 32, and a first adhesive layer 55. The wavelength conversion member 50 according to the third embodiment may include a sealing layer 59 that covers the side surfaces of the first intermediate layer 31, the wavelength conversion layer 20, and the second intermediate layer 32. The sealing layer 59 is preferably arranged around the first intermediate layer 31, the wavelength conversion layer 20, and the second intermediate layer 32 so as not to contact with the side surface of the wavelength conversion layer 20 in order to suppress adverse effects on the wavelength conversion layer 20. By arranging the sealing layer 59 around the first intermediate layer 31, the wavelength conversion layer 20, and the second intermediate layer 32, the periphery of the wavelength conversion layer 20 is protected, and the wavelength conversion layer 20 is less likely to come into contact with moisture or gases contained in the atmosphere, thereby suppressing the deterioration of the wavelength conversion layer.

The sealing layer can use the same material as that of the first adhesive layer according to the first embodiment.

Figure 5:
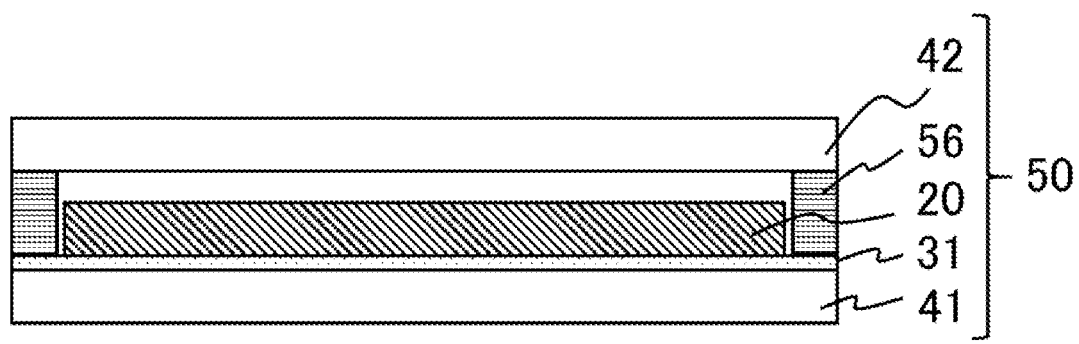
FIG. 5 is a schematic cross-sectional view of an exemplary wavelength conversion member according to a fourth embodiment.

FIG. 5 is a schematic cross-sectional view showing a schematic configuration of the wavelength conversion member according to the fourth embodiment. The wavelength conversion member 50 preferably includes a first translucent member 41, a second translucent member 42, a wavelength conversion layer 20 arranged between the first translucent member 41 and the second translucent member 42, a first intermediate layer 31 arranged on the first translucent member 41 side of the wavelength conversion layer 20, and a second adhesive layer 56 that is arranged around the wavelength conversion layer 20 and has a thickness larger than that of the wavelength conversion layer 20 such that the wavelength conversion layer 20 does not come into contact with the second translucent member 42.

By arranging the second adhesive layer, which has a thickness larger than that of the wavelength conversion layer such that the wavelength conversion layer does not come into contact with the second translucent member, around the wavelength conversion layer, the wavelength conversion layer and the second translucent member do not come into contact with each other, and the reaction between the fluorescent material contained in the wavelength conversion layer and the resin contained in the second translucent member is suppressed, thereby suppressing the decrease in the light emission intensity of the fluorescent material. The wavelength conversion layer can use the same wavelength conversion layer as that of the wavelength conversion member according to the first embodiment.

The second adhesive layer can use the same material as that of the first adhesive layer according to the first embodiment. Specifically, the thickness of the second adhesive layer may be in a range of 100 nm or more and 18 µm or less, and may be in a range of 200 nm or more and 17 µm or less.

The wavelength conversion member may include a second wavelength conversion layer containing a second fluorescent material having a light emission peak wavelength in a wavelength range different from that of the fluorescent material having a perovskite-type structure and a composition of $ABX_3$. When the wavelength conversion member includes a second wavelength conversion layer, the fluorescent material having a perovskite-type structure and a composition of $ABX_3$ can be designated as a first fluorescent material, and the wavelength conversion layer containing this first fluorescent material can be designated as a first wavelength conversion layer.

Figure 6:
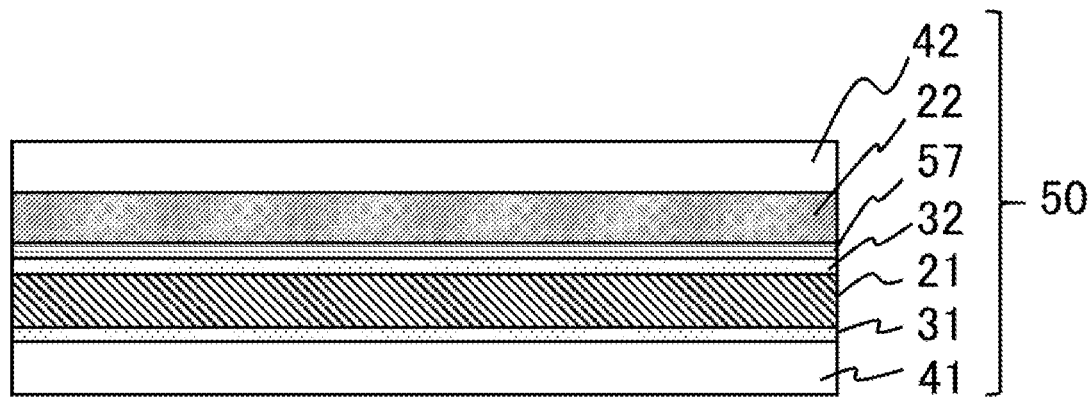
FIG. 6 is a schematic cross-sectional view of an exemplary wavelength conversion member according to a fifth embodiment.

FIG. 6 is a schematic cross-sectional view showing a schematic configuration of the wavelength conversion member according to the fifth embodiment. The wavelength conversion member 50 includes a first translucent member 41, a second translucent member 42, a first wavelength conversion layer 21 arranged between the first translucent member 41 and the second translucent member 42, a first intermediate layer 31 arranged on the first wavelength conversion layer 21 on the side of the first translucent member 41, a second intermediate layer 32 arranged on the first wavelength conversion layer 21 on the side of the second translucent member 42, and a second wavelength conversion layer 22 arranged between the second intermediate layer 32 and the second translucent member 42. The wavelength conversion member 50 may include a third adhesive layer 57 arranged between the second intermediate layer 32 and the second wavelength conversion layer 22 so as to bond the second intermediate layer 32 with the second wavelength conversion layer 22. However, the second intermediate layer 32 and the second wavelength conversion layer 22 may be directly bonded to each other without the third adhesive layer 57.

Figure 7:
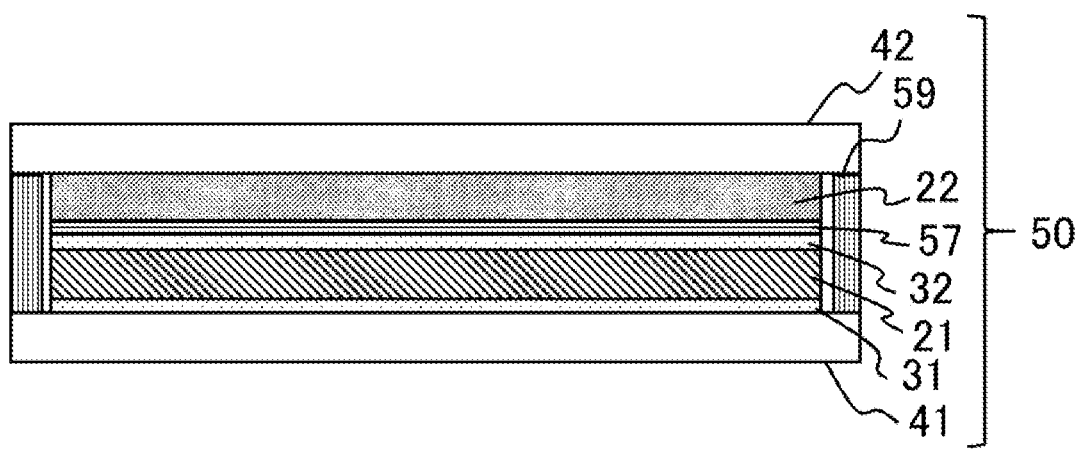
FIG. 7 is a schematic cross-sectional view of an exemplary wavelength conversion member according to a sixth embodiment.

FIG. 7 is a schematic cross-sectional view showing a schematic configuration of the wavelength conversion member according to the sixth embodiment. Similar to the fifth embodiment described above, the wavelength conversion member 50 according to the sixth embodiment includes a first intermediate layer 31, a first wavelength conversion layer 21, a second intermediate layer 32, a third adhesive layer 57, and a second wavelength conversion layer 22 between a first translucent member 41 and a second translucent member 42, in order from the side of the first translucent member 41. The wavelength conversion member 50 according to the sixth embodiment also includes a sealing layer 59 that is arranged between the first translucent member 41 and the second translucent member 42 and covers the side surfaces of the first intermediate layer 31, the first wavelength conversion layer 21, the second intermediate layer 32, the third adhesive layer 57, and the second wavelength conversion layer 22. The sealing layer 59 can use the same material as that of the sealing layer described above. By arranging such a sealing layer 59, the side surfaces of the first wavelength conversion layer 21 and the second wavelength conversion layer 22 are less likely to come into contact with moisture or gases contained in the atmosphere, thereby suppressing the deterioration of the first wavelength conversion layer and the second wavelength conversion layer.

Figure 8:
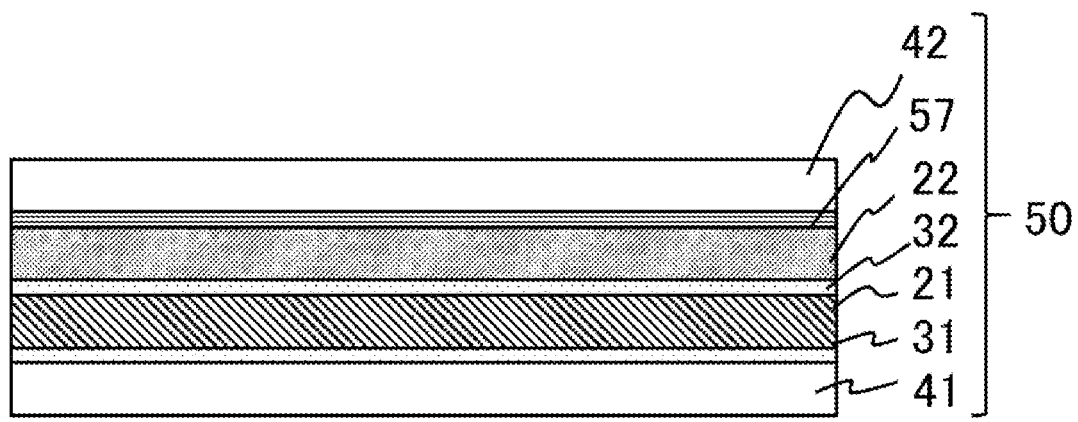
FIG. 8 is a schematic cross-sectional view of an exemplary wavelength conversion member according to a seventh embodiment.

FIG. 8 is a schematic cross-sectional view showing a schematic configuration of the wavelength conversion member according to the seventh embodiment. The wavelength conversion member 50 includes a second wavelength conversion layer 22 formed in contact with a second intermediate layer 32, which is bonded to a second translucent member 42 via a third adhesive layer 57. However, the second wavelength conversion layer 22 and the second translucent member 42 may be directly bonded to each other without the third adhesive layer 57.

Figure 9:
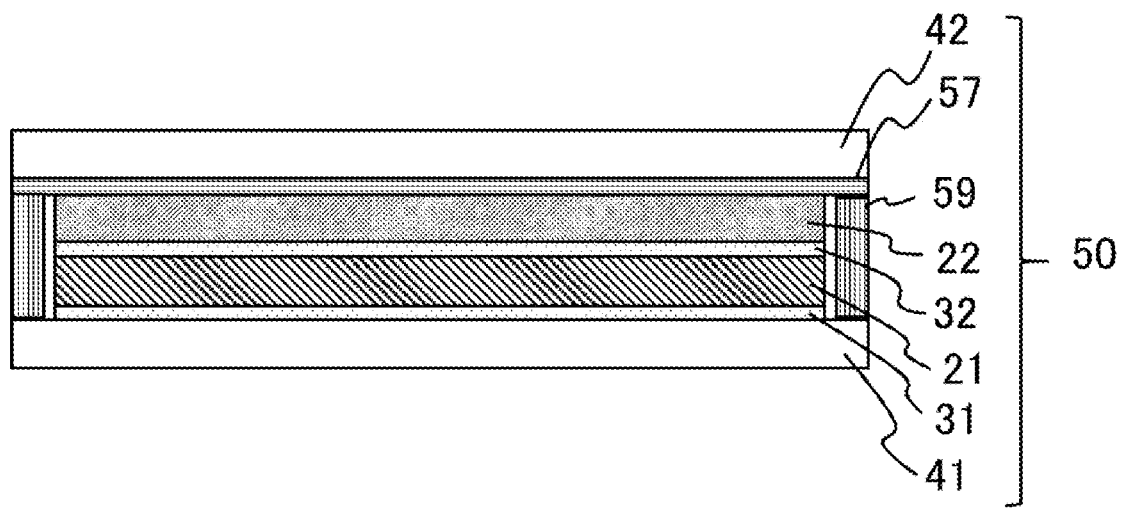
FIG. 9 is a schematic cross-sectional view of an exemplary wavelength conversion member according to an eighth embodiment.

FIG. 9 is a schematic cross-sectional view showing a schematic configuration of the wavelength conversion member according to the eighth embodiment. The wavelength conversion member 50 according to the eighth embodiment includes a first intermediate layer 31, a first wavelength conversion layer 21, a second intermediate layer 32, a second wavelength conversion layer 22, and a third adhesive layer 57 between a first translucent member 41 and a second translucent member 42, in order from the side of the first translucent member 41. The wavelength conversion member 50 according to the eighth embodiment also includes a sealing layer 59 that is arranged between the first translucent member 41 and the third adhesive layer 57 and covers the side surfaces of the first intermediate layer 31, the first wavelength conversion layer 21, the second intermediate layer 32, and the second wavelength conversion layer 22. The sealing layer 59 can use the same material as that of the sealing layer described above. The sealing layer 59 and the third adhesive layer 57 may be in contact with each other and integrated.

Second Fluorescent Material

The second fluorescent material contained in the second wavelength conversion layer preferably has at least one light emission peak wavelength in a range of 600 nm or more and 670 nm or less when excited by light having a light emission peak wavelength in a range of 380 nm or more and 500 nm or less.

The second fluorescent material preferably contains at least one fluorescent material selected from the group consisting of, for example, (2a) a silicon nitride-based fluorescent material that contains at least one element selected from Sr and Ca, and Al in the composition and is activated with Eu, (2b) an alkaline earth metal silicon nitride-based fluorescent material that is activated with Eu, (2c) a fluoride fluorescent material that contains at least one element selected from the group consisting of K, Li, Na, Rb, Cs, and $NH_4^+$, and at least one element selected from the group consisting of Group 4 elements, Group 13 elements and Group 14 elements in the composition and is activated with Mn, and (2d) a fluorogermanate fluorescent material that is activated with Mn; and may contain two or more types of fluorescent materials.

(2a) The silicon nitride-based fluorescent material containing at least one element selected from Sr and Ca, and Al in the composition and is activated with Eu includes a fluorescent material containing a composition represented by the following formula (i):

$$(Ca_{1-s-t}Sr_sEu_t)_xAl_uSi_vN_w \qquad (i)$$

wherein s, t, u, v, w, and x each satisfy $0 \leq s \leq 1.0$, $0 \leq t < 1.0$, $0 < s+t < 1.0$, $0.8 \leq x \leq 1.0$, $0.8 \leq u \leq 1.2$, $0.8 \leq v \leq 1.2$, $1.9 \leq u+v \leq 2.1$, and $2.5 \leq w \leq 3.5$. The fluorescent material containing the composition represented by the formula (i) may be expressed as $CaAlSiN_3$:Eu fluorescent material or $(Sr,Ca)AlSiN_3$:Eu fluorescent material. In the present specification, plural elements sectioned by comma (,) in the formulae representing the compositions of fluorescent materials mean that at least one of these plural elements is contained in the composition. In the present specification, in the formulae representing the compositions of the fluorescent materials, the part before the colon (:) represents elements and the molar ratios constituting a host crystal, and the part after the colon (;) represents activating elements.

(2b) The alkaline earth metal silicon nitride-based fluorescent material that is activated with Eu includes a fluorescent material containing a composition represented by the following formula GO:

$$(Ca_{1-p-q-r}Sr_pBa_qEu_r)_2Si_5N_8 \qquad (ii)$$

wherein p, q, and r each satisfy $0 \leq p \leq 1.0$, $0 \leq q \leq 1.0$, $0 < r < 1.0$, and $p+q+r \leq 1.0$.

(2c) The fluoride fluorescent material that contains at least one element selected from the group consisting of K, Li, Na, Rb, Cs, and $NH_4^+$, and at least one element selected from the group consisting of Group 4 elements, Group 13 elements, and Group 14 elements in the composition and is activated with Mn includes a fluorescent material containing a composition represented by the following formula (iii);

$$A_2[M^1_{1-g}Mn^{4+}_gF_6] \qquad (iii)$$

wherein A represents at least one element selected from the group consisting of K, Li, Na, Rb, Cs, and $NH_4^+$, and is, for example, an element containing at least K; $M^1$ represents at least one element selected from the group consisting of Group 4 elements, Group 13 elements, and Group 14 elements, and examples thereof include Si and Al; and g satisfies $0 < g < 0.2$.

(2d) The fluorogermanate fluorescent material that is activated with Mn includes a fluorescent material containing a composition represented by the following formula (iv):

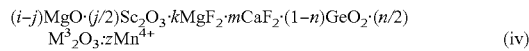

$$(i-j)\text{MgO} \cdot (j/2)\text{Sc}_2\text{O}_3 \cdot k\text{MgF}_2 \cdot m\text{CaF}_2 \cdot (1-n)\text{GeO}_2 \cdot (n/2)\text{M}^3{}_2\text{O}_3 : z\text{Mn}^{4+} \quad \text{(iv)}$$

wherein $M^3$ represents at least one selected from the group consisting of Al, Ga, and In; and i, j, k, m, n, and z each satisfy $2 \leq i \leq 4$, $0 \leq j < 0.5$, $0 < k < 1.5$, $0 \leq m < 1.5$, $0 < n < 0.5$, and $0 < z < 0.05$.

When the second fluorescent material is a fluorescent material having a light emission peak wavelength in a range of 600 nm or more and 670 nm or less when excited by light having a light emission peak wavelength in a range of 380 nm or more and 500 nm or less, specific examples of the second fluorescent material include fluoride fluorescent materials represented by $K_2(Si,Al)F_6:Mn$, magnesium fluorogermanate fluorescent materials represented by $3 \cdot 5\text{MgO} \cdot 0 \cdot 5\text{MgF}_2 \cdot \text{GeO}_2 : \text{Mn}^{4+}$, $Ca_2Si_5N_8:Eu$, $(Ba,Sr)_2Si_5N_8:Eu$, $(Sr,Ca)AlSiN_3:Eu$, $CaAlSiN_3:Eu$, and $SrLiAl_3N_4:Eu$. The second fluorescent material preferably uses (2c) the fluoride fluorescent material that contains at least one element selected from the group consisting of K, Li, Na, Rb, Cs, and $NH_4^+$, and at least one element selected from the group consisting of Group 4 elements, Group 13 elements and Group 14 elements in the composition and is activated with Mn, which has a narrow full width at half maximum of 10 nm or less in the light emission spectrum, high color purity, and excellent color reproducibility.

The second fluorescent material may contain a cesium-lead halide having a perovskite-type structure in addition to the above-mentioned fluorescent material. That is, the second fluorescent material may contain a cesium-lead halide having a composition represented by $CsPb(Br_{1-x}I_x)_3$ ($0 \leq x < 1.0$), and/or may contain a cesium-lead halide having a composition represented by $Cs_4Pb(Br_{1-x}I_x)_6$ ($0 \leq x < 1.0$). The cesium-lead halide having a perovskite-type structure and a composition represented by $CsPb(Br_{1-x}I_x)_3$ has at least one light emission peak wavelength in a range of 600 nm or more and 670 nm or less when excited by light having a light emission peak wavelength in a range of 380 nm or more and 500 nm or less.

The resin can use at least one resin selected from the group consisting of silicone-based resins, epoxy-based resins, acrylic-based resins, and modified resins of these.

When the second wavelength conversion layer contains a resin, the second fluorescent material is preferably contained in a range of 1 part by mass or more and 50 parts by mass or less, may be contained in a range of 2 parts by mass or more and 40 parts by mass or less, and may be contained in a range of 3 parts by mass or more and 30 parts by mass or less, relative to 100 parts by mass of the resin.

The thickness of the second wavelength conversion layer is preferably in a range of 0.1 μm or more and 500 μm or less, and more preferably in a range of 0.2 μm or more and 300 μm or less.

The third adhesive layer in the wavelength conversion members according to the fifth to eighth embodiments can use the same adhesive layer as that described above.

Figure 10:
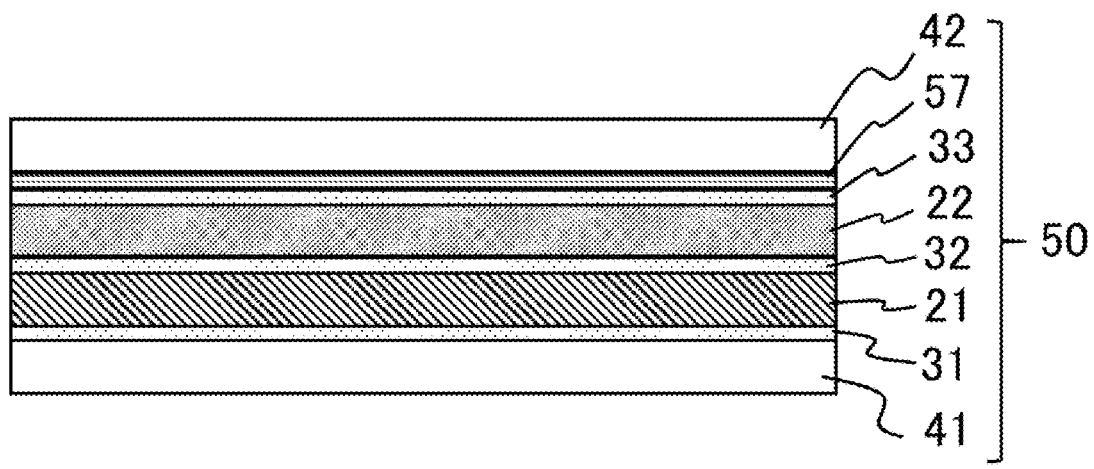
FIG. 10 is a schematic cross-sectional view of an exemplary wavelength conversion member according to a ninth embodiment.

FIG. 10 is a schematic cross-sectional view showing a schematic configuration of the wavelength conversion member according to the ninth embodiment. The wavelength conversion member 50 includes a first translucent member 41 and a second translucent member 42, and also includes a first intermediate layer 31, a first wavelength conversion layer 21, a second intermediate layer 32, a second wavelength conversion layer 22, a third intermediate layer 33, and a third adhesive layer 57 between the first translucent member 41 and the second translucent member 42, in order from the side of the first translucent member 41. The third intermediate layer 33 and the second translucent member 42 may be directly bonded to each other without the third adhesive layer 57.

Figure 11:
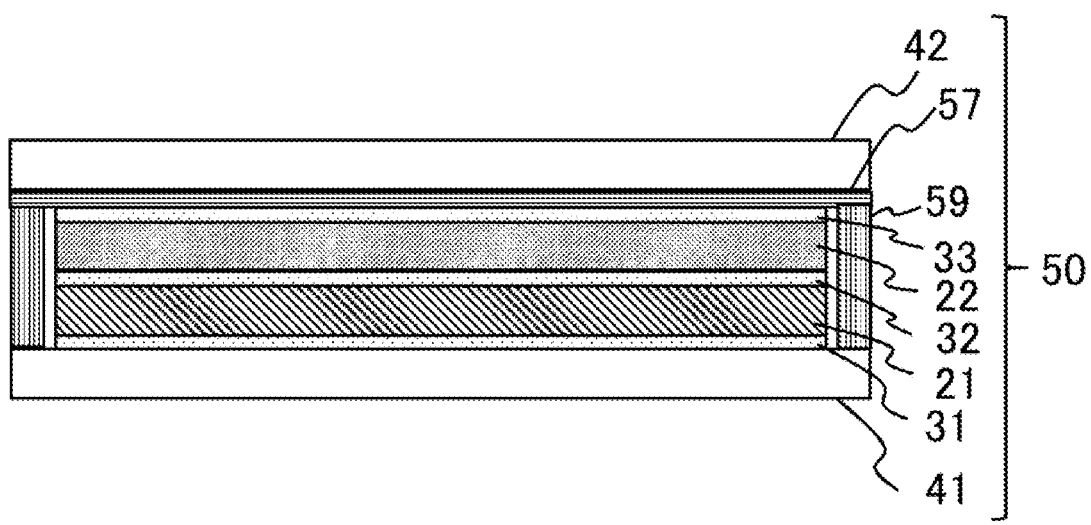
FIG. 11 is a schematic cross-sectional view of an exemplary wavelength conversion member according to a tenth embodiment.

FIG. 11 is a schematic cross-sectional view showing a schematic configuration of the wavelength conversion member according to the tenth embodiment. The wavelength conversion member 50 includes a first intermediate layer 31, a first wavelength conversion layer 21, a second intermediate layer 32, a second wavelength conversion layer 22, a third intermediate layer 33, and a third adhesive layer 57 between a first translucent member 41 and a second translucent member 42, in order from the side of the first translucent member 41, and also includes a sealing layer 59 provided around these except the third adhesive layer 57. The sealing layer 59 can use the same material as that of the sealing layer according to the fourth embodiment. The sealing layer 59 preferably has a thickness capable of covering the entire circumference of the first intermediate layer 31, the first wavelength conversion layer 21, the second intermediate layer 32, the second wavelength conversion layer 22, and the third intermediate layer 33, which are arranged between the first translucent member 41 and the second translucent member 42. The sealing layer 59 and the third adhesive layer 57 may be in contact with each other and integrated. By arranging the sealing layer 59, the periphery of the first wavelength conversion layer 21 and the second wavelength conversion layer 22 is protected, and the first wavelength conversion layer 21 and the second wavelength conversion layer 22 are less likely to come into contact with moisture or gases contained in the atmosphere, thereby suppressing the deterioration of the first wavelength conversion layer and the second wavelength conversion layer.

The third intermediate layer in the wavelength conversion members according to the ninth and tenth embodiments can use the same intermediate layer as that described above. The third adhesive layer can use the same adhesive layer as the first adhesive layer according to the first embodiment. The first wavelength conversion layer can use the same wavelength conversion layer as that in the first embodiment. The second wavelength conversion layer can use the same wavelength conversion layer as that in the fifth embodiment.

The wavelength conversion member includes a layered first translucent member and a layered second translucent member, and the wavelength conversion layer may include a first wavelength conversion layer containing a first fluorescent material, which is a fluorescent material having a perovskite-type structure and a composition of $ABX_3$, and a second wavelength conversion layer containing a second fluorescent material having a light emission peak wavelength in a wavelength range different from that of the first fluorescent material. The wavelength conversion member includes the first wavelength conversion layer and the second wavelength conversion layer arranged between the first translucent member and the second translucent member, and may include a first intermediate layer arranged between the first translucent member and the first wavelength conversion layer, a second intermediate layer arranged between the first wavelength conversion layer and the second wavelength conversion layer, which is on the first wavelength conversion layer on the side of the second translucent member, and a fourth adhesive layer having a thickness larger than that of the second wavelength conversion layer such that the second wavelength conversion layer does not come into contact with the second translucent member, which is arranged around the second wavelength conversion layer. The wavelength conversion member preferably includes a second wavelength conversion layer having an area smaller than that of the second intermediate layer in order to arrange the fourth adhesive layer. By arranging the fourth adhesive layer, which has a thickness larger than that of the second wavelength conversion layer such that the second wavelength conversion layer does not come into contact with the second translucent member, around the second wavelength conversion layer, the second wavelength conversion layer and the second translucent member do not come into contact with each other, and the reaction between the second fluorescent material, which is a fluorescent material having a perovskite-type structure, contained in the second wavelength conversion layer and the resin contained in the second translucent member is suppressed, thereby suppressing the decrease in the light emission intensity of the second fluorescent material.

Figure 12:
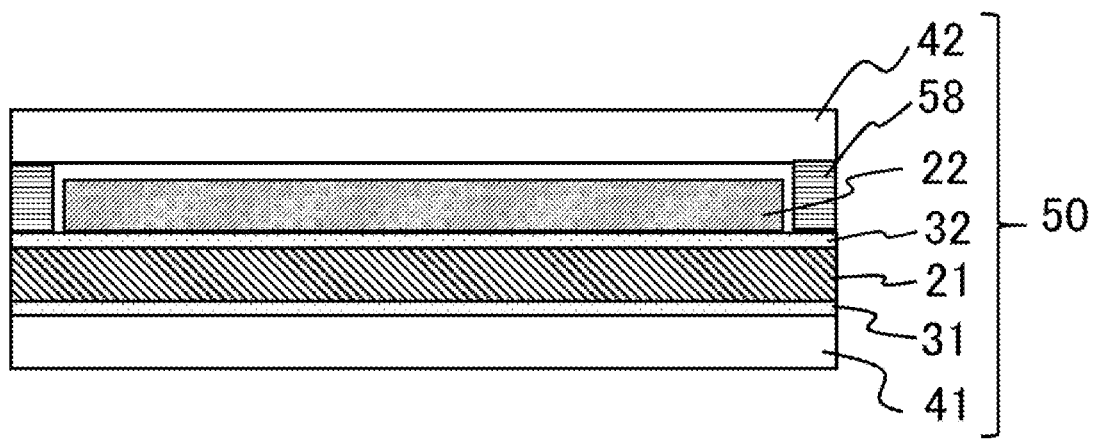
FIG. 12 is a schematic cross-sectional view of an exemplary wavelength conversion member according to an eleventh embodiment.

FIG. 12 is a schematic cross-sectional view showing a schematic configuration of the wavelength conversion member according to the eleventh embodiment. The wavelength conversion member 50 includes a first intermediate layer 31, a first wavelength conversion layer 21, a second intermediate layer 32, and a second wavelength conversion layer 22 between a first translucent member 41 and a second translucent member 42, in order from the side of the first translucent member 41, and also includes a fourth adhesive layer 58 that is arranged around the second wavelength conversion layer 22 and has a thickness larger than that of the second wavelength conversion layer 22 such that the second wavelength conversion layer 22 does not come into contact with the second translucent member 42. The wavelength conversion member 50 preferably includes a second wavelength conversion layer 22 having an area smaller than that of the second intermediate layer 32 in order to arrange the fourth adhesive layer 58.

The first wavelength conversion layer in the wavelength conversion member according to the eleventh embodiment can use the same wavelength conversion layer as in the first embodiment. The second wavelength conversion layer can use the same wavelength conversion layer as in the fifth embodiment.

The fourth adhesive layer can use the same material as that of the adhesive layer described above. Specifically, the thickness of the fourth adhesive layer may be in a range of 100 nm or more and 18 μm or less, and may be in a range of 200 nm or more and 17 μm or less.

Method for Producing Wavelength Converting Member

Figure 13:
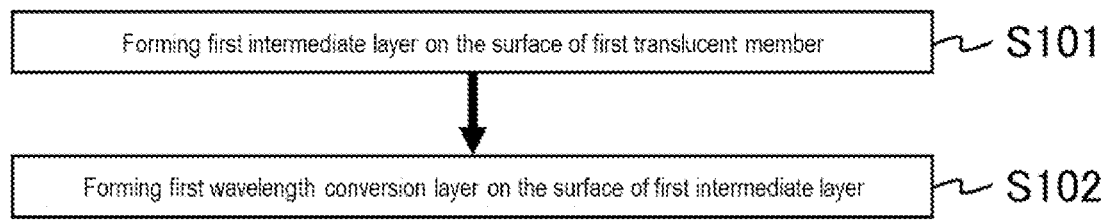
FIG. 13 is a flowchart showing an exemplary method for producing an exemplary wavelength conversion member according to a first embodiment.

The method for producing a wavelength conversion member includes a step of forming a first intermediate layer on the surface of a first translucent member containing a resin, and a step of forming a first wavelength conversion layer containing a first fluorescent material having a perovskite-type structure and a composition of $ABX_3$ on the surface of the first intermediate layer. FIG. 13 is a flowchart showing a method for producing a wavelength conversion member according to a first embodiment. The method for producing a wavelength conversion member according to the first embodiment includes a step S101 of forming a first intermediate layer on the surface of a first translucent member, and a step S102 of forming a first wavelength conversion layer on the surface of the first intermediate layer. The method for producing a wavelength conversion member may include a step of preparing a first translucent member.

Step of Preparing First Translucent Member or First Translucent Member

The first translucent member can use the same translucent member as that used for the wavelength conversion member described above as the first translucent member.

Step of Forming First to Third Intermediate Layers

The first to third intermediate layers (hereinafter also referred to as "intermediate layers") are preferably composed of at least one oxide selected from the group consisting of silicon dioxide, aluminum oxide, zirconium oxide, magnesium oxide, titanium oxide, cerium oxide, zinc oxide, and tin oxide. The intermediate layers are preferably formed by depositing the oxide serving as a raw material on the surface of the first translucent member or the surface of the wavelength conversion layer using a vapor deposition method or a sputtering method. The vapor deposition method may be either a physical vapor deposition method or a chemical vapor deposition method. Examples of the physical vapor deposition method include an electron beam vapor deposition method, a resistance heating vapor deposition method, and an ion plating method. Examples of the chemical vapor deposition method include a chemical vapor deposition method (CVD). In the sputtering method, gas particles collide with a targeted raw material, and the raw material that is blown off by the impact can be deposited on the surface of the member to form the first intermediate layer. The intermediate layers are preferably formed by any of the electron beam vapor deposition method, the resistance heating vapor deposition method, the ion plating method, and the sputtering method. By using these methods, an intermediate layer having a stable composition and a substantially uniform thickness can be formed on the surface of the translucent member or the surface of the wavelength conversion layer in a relatively short time.

In the case of forming the intermediate layers by the sputtering method, a voltage in a range of 50 V or more and 1,000 V or less can be applied between the electrodes at room temperature in an argon atmosphere to form the first intermediate layer.

Step of Forming First Wavelength Conversion Layer

The first wavelength conversion layer can be formed by depositing a raw material constituting the fluorescent material having a perovskite-type structure and a composition of $ABX_3$ onto the surface of the intermediate layer by a vapor deposition method. The vapor deposition method can use either a physical vapor deposition method or a chemical vapor deposition method. Examples of the physical vapor deposition method include a resistance heating vapor deposition method. In the resistance heating vapor deposition method, it is preferable to perform vapor deposition by an electron bombardment vapor deposition method. The electron bombardment vapor deposition method is a method in which a crucible filled with a vapor deposition source is irradiated with an electron beam to indirectly evaporate the vapor deposition source and deposit it on an object. The electron bombardment vapor deposition method reduces damage from reflected X-rays and improves film quality and adhesion compared to the electron beam vapor deposition method in which the electron beam is directly irradiated to the vapor deposition source. When the fluorescent material having a perovskite-type structure and a composition of $ABX_3$ is a cesium-lead halide, the wavelength conversion layer is preferably produced using the physical vapor deposition method. The first wavelength conversion layer containing the fluorescent material composed of a cesium-lead halide having a perovskite-type structure and a composition of $ABX_3$ is preferably formed by the physical vapor deposition method, since a first wavelength conversion layer having high light emission efficiency and containing no resin can be obtained.

When the fluorescent material having a perovskite-type structure and a composition of $ABX_3$ contained in the first wavelength conversion layer is, for example, cesium-lead bromide, cesium bromide and lead bromide can be used as materials for forming the first wavelength conversion layer. For example, as the materials for forming the first wavelength conversion layer, cesium bromide (CsBr) and lead bromide ($PbBr_2$) are preferably used in a vapor deposition ratio in a range of 1:1 or more and 10:1 or less, may be used in a range of 2:1 or more and 9:1 or less, and may be used in a range of 3:1 or more and 8:1 or less. The cesium halide is preferably cesium bromide. The lead halide is preferably lead bromide. Specifically, the first wavelength conversion layer is produced by using cesium bromide and lead bromide as raw materials in a vapor deposition ratio in a range of 1:1 or more and 10:1 or less, by the physical vapor deposition method. When the fluorescent material having a perovskite-type structure and a composition of $ABX_3$ contained in the first wavelength conversion layer is cesium-lead bromide, the cesium-lead bromide having a perovskite-type structure and a composition of $ABX_3$ contained in the first wavelength conversion layer may have a composition in which a part of bromine is replaced with fluorine, chlorine, or iodine.

When producing the wavelength conversion member according to the first embodiment described above, the first intermediate layer and the first translucent member may be provided only on one surface of the first wavelength conversion layer. When producing the wavelength conversion member according to the second embodiment described above, the first intermediate layer and the first translucent member may be provided on one surface of the first wavelength conversion layer, and the second intermediate layer and the second translucent member may be provided on the surface opposite to the first intermediate layer of the first wavelength conversion layer.

Figure 14:
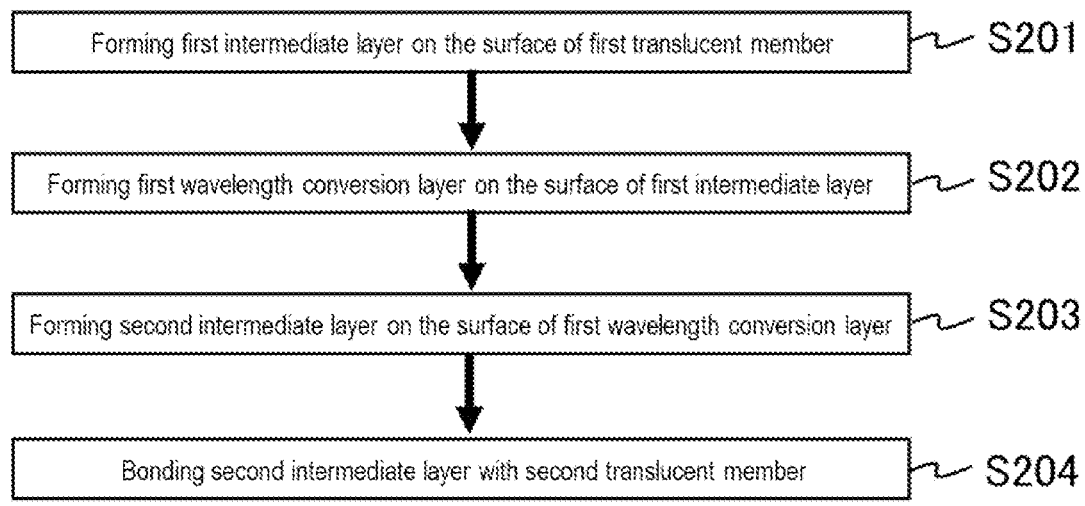
FIG. 14 is a flowchart showing an exemplary method for producing an exemplary wavelength conversion member according to a second embodiment.

The method for producing a wavelength conversion member may include a step of forming a second intermediate layer on the surface of a wavelength conversion layer, and a step of bonding the second intermediate layer with a second translucent member. FIG. 14 is a flowchart showing a method for producing a wavelength conversion member according to a second embodiment. The method for producing a wavelength conversion member according to the second embodiment includes a step S201 of forming a first intermediate layer on the surface of a first translucent member, a step S202 of forming a wavelength conversion layer on the surface of the first intermediate layer, a step S203 of forming a second intermediate layer on the surface of the wavelength conversion layer, and a step S204 of bonding the second intermediate layer with a second translucent member.

Step of Bonding Second Intermediate Layer with Second Translucent Member

The method for producing a wavelength conversion member preferably includes a step of bonding a second intermediate layer with a second translucent member. In the step of bonding a second intermediate layer with a second translucent member, the second intermediate layer and the second translucent member are preferably bonded together via a first adhesive layer. The adhesive layer may be formed on the second intermediate layer or on the second translucent member. The first adhesive layer preferably contains at least one resin selected from the group consisting of, for example, polyester resins, acrylic resins, acrylic urethane resins, polyester acrylate resins, polyurethane acrylate resins, epoxy acrylate resins, and urethane resins; and may contain two or more types of resins. The first adhesive layer is formed by coating a first adhesive layer composition containing the above-mentioned resin on one surface of the second intermediate layer or the second translucent member. The first adhesive layer composition can be coated using known methods such as a knife coating method, a roll coating method, a bar coating method, a blade coating method, a roll coating method, a die coating method, and a gravure coating method. The thickness of the first adhesive layer can be in a range of 0.005 µm or more and 10 µm or less.

The wavelength conversion member may be formed by having a first intermediate layer and a first translucent member on one surface of a first wavelength conversion layer, and the wavelength conversion member according to the second embodiment may be formed by having a first intermediate layer and a first translucent member on one surface of a first wavelength conversion layer, and a second intermediate layer and a second translucent member on the other surface of the first wavelength conversion layer.

Figure 15:
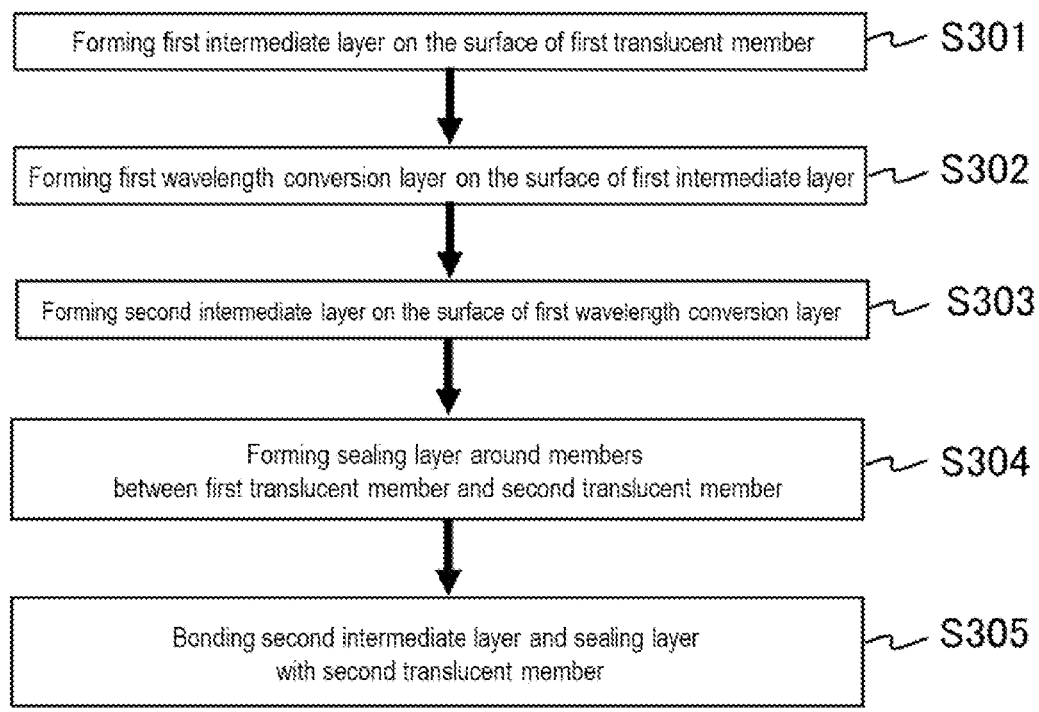
FIG. 15 is a flowchart showing an exemplary method for producing an exemplary wavelength conversion member according to a third embodiment.

The method for producing a wavelength conversion member may include a step of forming a sealing layer. FIG. 15 is a flowchart showing a method for producing a wavelength conversion member according to a third embodiment. The method for producing a wavelength conversion member according to the third embodiment includes a step S301 of forming a first intermediate layer on the surface of a first translucent member, a step S302 of forming a first wavelength conversion layer on the surface of the first intermediate layer, a step S303 of forming a second intermediate layer on the surface of the first wavelength conversion layer; and may include a step S304 of forming a sealing layer around the first intermediate layer, the first wavelength conversion layer, and the second intermediate layer, and a step S305 of bonding the second intermediate layer and the sealing layer with the second translucent member.

When forming a sealing layer, the first intermediate layer, the first wavelength conversion layer, and the second intermediate layer are preferably formed so as to have an area smaller than those of the first translucent member and the second translucent member. When forming a sealing layer separated from the first intermediate layer, the first wavelength conversion layer, and the second intermediate layer, the sealing layer is preferably formed by covering the first intermediate layer, the first wavelength conversion layer, and the second intermediate layer with a covering member, and then coating a sealing layer composition around the first intermediate layer, the first wavelength conversion layer, and the second intermediate layer. After forming the sealing layer, it is preferable to remove the covering member. When forming a sealing layer in contact with the first intermediate layer, the first wavelength conversion layer, and the second intermediate layer, the sealing layer may be formed by directly coating a sealing layer composition around the first intermediate layer, the first wavelength conversion layer, and the second intermediate layer. After forming the sealing layer, a first adhesive layer composition may be coated on the top surface of the sealing layer and one surface of the second intermediate layer on the side of the second translucent member, and the second intermediate layer and sealing layer may be bonded to the second translucent member by interposing a first adhesive layer.

Figure 16:
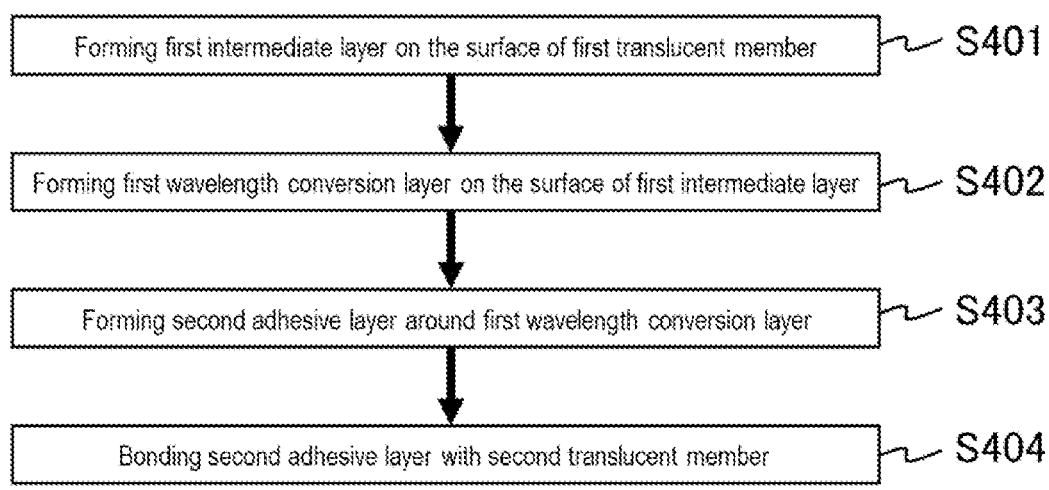
FIG. 16 is a flowchart showing an exemplary method for producing an exemplary wavelength conversion member according to a fourth embodiment.

The method for producing a wavelength conversion member may include a step of forming a second adhesive layer having a thickness larger than that of the first wavelength conversion layer around the first wavelength conversion layer on the surface of the first intermediate layer, and a step of bonding the second adhesive layer with the second translucent member. FIG. 16 is a flowchart showing a method for producing a wavelength conversion member according to a fourth embodiment. The method for producing a wavelength conversion member according to the fourth embodiment may include a step S401 of forming a first intermediate layer on the surface of a first translucent member, a step S402 of forming a first wavelength conversion layer on the surface of the first intermediate layer, a step S403 of forming a second adhesive layer having a thickness larger than that of the first wavelength conversion layer around the first wavelength conversion layer on the surface of the first intermediate layer, and a step S404 of bonding the second adhesive layer with the second translucent member.

Step of Forming Second Adhesive Layer

The first wavelength conversion layer formed on the surface of the first intermediate layer is preferably formed so as to have an area smaller than that of the first intermediate layer in order to form the second adhesive layer around the first wavelength conversion layer. The second adhesive layer is preferably formed by covering the wavelength conversion layer formed on the first intermediate layer with a covering member, and then coating a second adhesive layer composition so as to have a thickness larger than that of the wavelength conversion layer by a known method in the same manner as the first adhesive layer described above. After forming the second adhesive layer, it is preferable to remove the covering member. The second adhesive layer preferably uses a second adhesive layer composition containing the same resin as that of the first adhesive layer described above.

In the case of producing a wavelength conversion member that includes a second wavelength conversion layer containing a second fluorescent material having a light emission peak wavelength in a wavelength range different from that of the fluorescent material having a perovskite-type structure and a composition of $ABX_3$ contained in the first wavelength conversion layer, as in the wavelength conversion members according to the fifth to eleventh embodiments, the method for producing a wavelength conversion member includes a step of forming a second wavelength conversion layer. The method for producing a wavelength conversion member preferably includes a step of forming a first intermediate layer on the surface of a first translucent member containing a resin, a step of forming a first wavelength conversion layer containing a first fluorescent material, which is the fluorescent material having a perovskite-type structure and a composition of $ABX_3$, on the surface of the first intermediate layer, a step of forming a second intermediate layer on the surface of the first wavelength conversion layer, and a step of forming a second wavelength conversion layer containing a second fluorescent material having a light emission peak wavelength in a wavelength range different from that of the first fluorescent material on the surface of the second intermediate layer.

Figure 17:
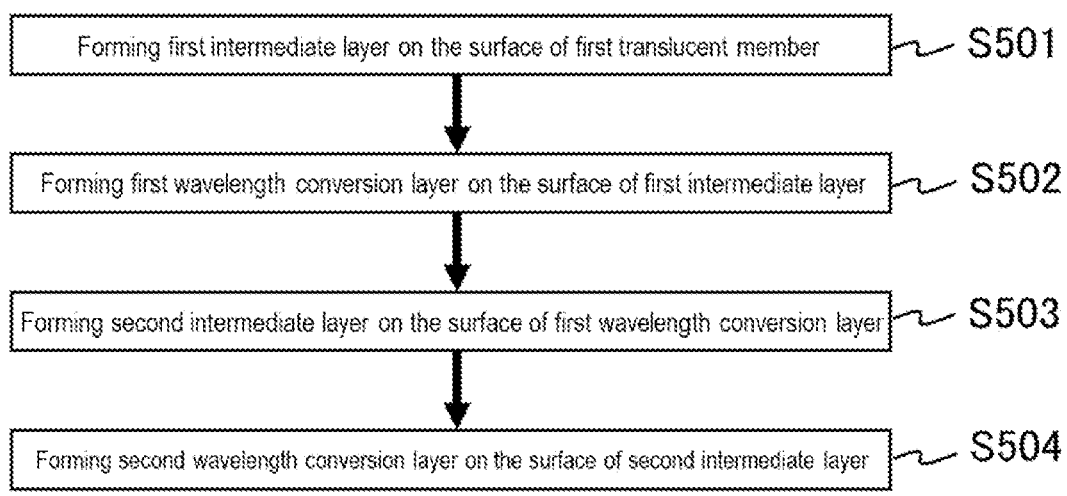
FIG. 17 is a flowchart showing an exemplary method for producing an exemplary wavelength conversion member according to a fifth embodiment.

FIG. 17 is a flowchart showing a method for producing a wavelength conversion member according to a fifth embodiment. The method for producing a wavelength conversion member according to the fifth embodiment includes a step S501 of forming a first intermediate layer on the surface of a first translucent member, a step S502 of forming a first wavelength conversion layer on the surface of the first intermediate layer, a step S503 of forming a second intermediate layer on the surface of the first wavelength conversion layer, and a step S504 of forming a second wavelength conversion layer on the surface of the second intermediate layer. The method for producing a wavelength conversion member may include a step of preparing a first translucent member. In the method for producing a wavelength conversion member according to the fifth embodiment, the first intermediate layer, the first wavelength conversion layer, and the second intermediate layer can be produced in the same manner as the method for producing a wavelength conversion member according to the second embodiment.

Step of Forming Second Wavelength Conversion Layer

When the second fluorescent material contained in the second wavelength conversion layer is a second fluorescent material having a perovskite-type structure and a light emission peak wavelength in a wavelength range different from that of the first fluorescent material, the second wavelength conversion layer can be formed by depositing raw materials constituting the composition of the second fluorescent material having a perovskite-type structure onto the surface of the second intermediate layer using a vapor deposition method, as in the first fluorescent material. When the second fluorescent material contained in the second wavelength conversion layer is a cesium-lead halide having a perovskite-type structure, the second wavelength conversion layer is preferably formed by a vapor deposition method. The vapor deposition method for forming the second wavelength conversion layer can use the same method as in the case of forming the first wavelength conversion layer. When the fluorescent material having a perovskite-type structure contained in the second wavelength conversion layer is a cesium-lead halide, a cesium halide and a lead halide can be used as wavelength conversion layer-forming materials. When the fluorescent material having a perovskite-type structure contained in the second wavelength conversion layer is, for example, cesium-lead iodide, cesium iodide and lead iodide can be used as second wavelength conversion layer-forming materials.

When the second fluorescent material contained in the second wavelength conversion layer is in the form of powder, the powdery second fluorescent material is mixed with a resin to produce a second wavelength conversion layer composition for forming a second wavelength conversion layer, and the second wavelength conversion layer composition can be used to form a second wavelength conversion layer. Examples of the resin contained in the second wavelength conversion layer include at least one selected from the group consisting of a silicone resin, a modified silicone resin, and an epoxy resin. The second fluorescent material contained in the second wavelength conversion layer composition may be contained in a range of 1 part by mass or more and 50 parts by mass or less, may be contained in a range of 2 parts by mass or more and 40 parts by mass or less, and may be contained in a range of 3 parts by mass or more and 30 parts by mass or less, relative to 100 parts by mass of the resin. Examples of the method for forming a second wavelength conversion layer using the second wavelength conversion layer composition include a printing method and a compression molding method. When forming a second wavelength conversion layer by a printing method, the second wavelength conversion layer composition for forming a second wavelength conversion layer is coated on the surface of the second intermediate layer or the second translucent member by a printing method and cured. The second wavelength conversion layer may be formed on the surface of the second intermediate layer, or on the surface of the second translucent member. When forming a second wavelength conversion layer by a compression molding method, the second wavelength conversion layer composition is placed in a mold, and the resin can be cured to form a second wavelength conversion layer. The second wavelength conversion layer may be bonded to the second intermediate layer via a third adhesive layer as in the wavelength conversion member according to the fifth or sixth embodiment. The second wavelength conversion layer may be bonded to the second translucent member via a third adhesive layer as in the wavelength conversion member according to the seventh or eighth embodiment.

The method for producing a wavelength conversion member may include a step of forming a sealing layer around members arranged between the first translucent member and the second translucent member. In the case of forming the wavelength conversion member according to the sixth embodiment, the method thereof may include, after the step of forming a second wavelength conversion layer, a step of forming a sealing layer around the first intermediate layer, the first wavelength conversion layer, the second intermediate layer, the third adhesive layer, and the second wavelength conversion layer, and a step of bonding the top surface of the sealing layer with the second translucent member. When forming a sealing layer, the first intermediate layer, the first wavelength conversion layer, the second intermediate layer, the third adhesive layer, and the second wavelength conversion layer are preferably formed so as to have an area smaller than those of the first translucent member and the second translucent member. When forming a sealing layer separated from the first intermediate layer, the first wavelength conversion layer, the second intermediate layer, the third adhesive layer, and the second wavelength conversion layer, the sealing layer is preferably formed by covering the first intermediate layer, the first wavelength conversion layer, the second intermediate layer, the third adhesive layer, and the second wavelength conversion layer with a covering member, and then coating a sealing layer composition around the first intermediate layer, the first wavelength conversion layer, the second intermediate layer, the third adhesive layer, and the second wavelength conversion layer. After forming the sealing layer, it is preferable to remove the covering member. When forming a sealing layer in contact with the first intermediate layer, the first wavelength conversion layer, the second intermediate layer, the third adhesive layer, and the second wavelength conversion layer, the sealing layer may be formed by directly coating a sealing layer composition around the first intermediate layer, the first wavelength conversion layer, the second intermediate layer, the third adhesive layer, and the second wavelength conversion layer. After forming the sealing layer, the top surface of the sealing layer may be bonded to the second translucent member.

In the case of forming the wavelength conversion member according to the eighth embodiment, the method thereof may include, after the step of forming a second wavelength conversion layer, a step of forming a sealing layer around the first intermediate layer, the first wavelength conversion layer, the second intermediate layer, and the second wavelength conversion layer, and a step of bonding the top surface of the sealing layer with the second translucent member. The sealing layer can be formed by the same method as in the case of producing the wavelength conversion member according to the sixth embodiment. After forming the sealing layer, a third adhesive layer composition may be coated on the top surface of the sealing layer and one surface of the second wavelength conversion layer on the side of the second translucent member, and the second wavelength conversion layer and sealing layer may be bonded to the second translucent member by interposing the third adhesive layer.

When the second wavelength conversion layer contains a second fluorescent material having a perovskite-type structure and a light emission peak wavelength in a wavelength range different from that of the first fluorescent material having a perovskite-type structure and a composition of $ABX_3$ contained in the first wavelength conversion layer, the method for producing a wavelength conversion member preferably includes a step of forming a third intermediate layer on the surface of the second wavelength conversion layer and a step of bonding the third intermediate layer with the second translucent member.

Figure 18:
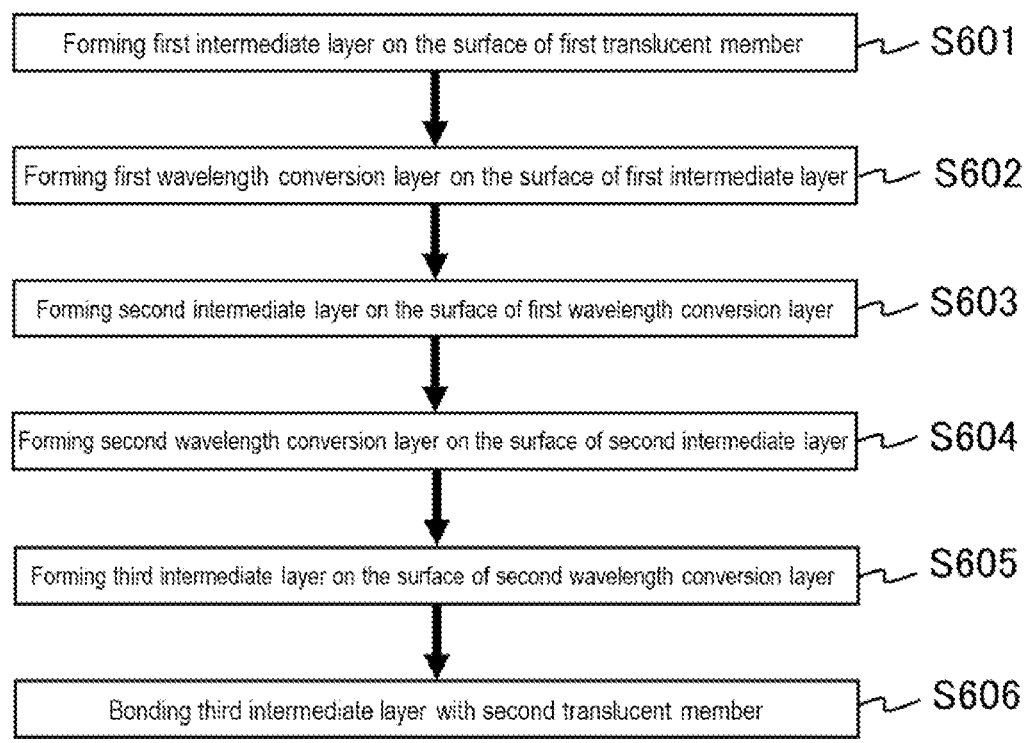
FIG. 18 is a flowchart showing a method for producing an exemplary wavelength conversion member according to a sixth embodiment.

FIG. 18 is a flowchart showing a method for producing a wavelength conversion member according to a sixth embodiment. The method for producing a wavelength conversion member according to the sixth embodiment includes a step S601 of forming a first intermediate layer on the surface of a first translucent member, a step S602 of forming a first wavelength conversion layer on the surface of the first intermediate layer, a step S603 of forming a second intermediate layer on the surface of the first wavelength conversion layer, a step S604 of forming a second wavelength conversion layer on the surface of the second intermediate layer, a step S605 of forming a third intermediate layer on the surface of the second wavelength conversion layer, and a step S606 of bonding the third intermediate layer with the second translucent member. The method for producing a wavelength conversion member may include a step of preparing a first translucent member; and the first intermediate layer, the first wavelength conversion layer, and the second intermediate layer can be produced in the same manner as the method for producing a wavelength conversion member according to the first embodiment.

Step of Bonding Third Intermediate Layer with Second Translucent Member

The method for producing a wavelength conversion member preferably includes a step of bonding the third intermediate layer with the second translucent member. In the step of bonding the third intermediate layer with the second translucent member, the third intermediate layer is preferably bonded to the second translucent member via the third adhesive layer. The third adhesive layer may be formed on the third intermediate layer or on the second translucent member. The third adhesive layer can be produced by using the same materials and the same method as in the first adhesive layer. The thickness of the third adhesive layer can be in a range of 0.005 μm or more and 10 μm or less.

The method for producing a wavelength conversion member may include a step of forming a sealing layer around members arranged between the first translucent member and the second translucent member. In the case of forming the wavelength conversion member according to the tenth embodiment, the method thereof may include, after the step of forming a third intermediate layer, a step of forming a sealing layer around the first intermediate layer, the first wavelength conversion layer, the second intermediate layer, the second wavelength conversion layer, and the third intermediate layer, and a step of bonding the top surface of the sealing layer with the second translucent member. When forming a sealing layer, the first intermediate layer, the first wavelength conversion layer, the second intermediate layer, the second wavelength conversion layer, and the third intermediate layer are preferably formed so as to have an area smaller than those of the first translucent member and the second translucent member. When forming a sealing layer separated from the first intermediate layer, the first wavelength conversion layer, the second intermediate layer, the second wavelength conversion layer, and the third intermediate layer, the sealing layer is preferably formed by covering the first intermediate layer, the first wavelength conversion layer, the second intermediate layer, the second wavelength conversion layer, and the third intermediate layer with a covering member, and then coating a sealing layer composition around the first intermediate layer, the first wavelength conversion layer, the second intermediate layer, the second wavelength conversion layer, and the third intermediate layer. After forming the sealing layer, it is preferable to remove the covering member. When forming a sealing layer in contact with the first intermediate layer, the first wavelength conversion layer, the second intermediate layer, the second wavelength conversion layer, and the third intermediate layer, the sealing layer may be formed by directly coating a sealing layer composition around these members. After forming the sealing layer, the third intermediate layer and the top surface of the sealing layer may be bonded to the second translucent member by interposing the third adhesive layer between the third intermediate layer and the second translucent member.

Figure 19:
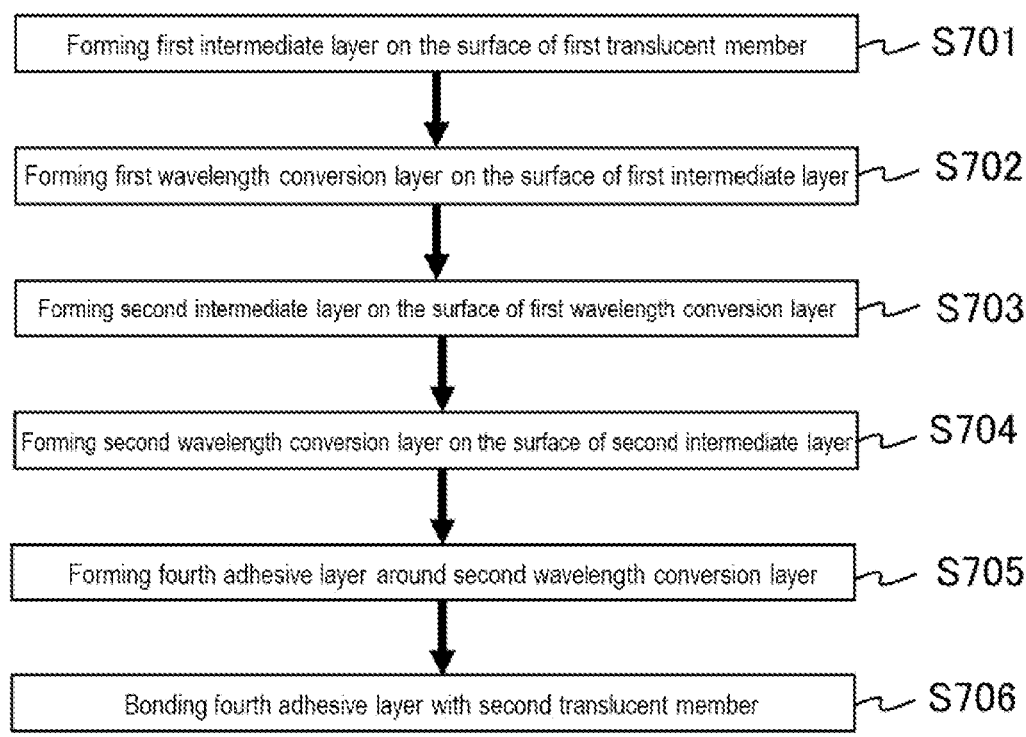
FIG. 19 is a flowchart showing a method for producing an exemplary wavelength conversion member according to a seventh embodiment.

The method for producing a wavelength conversion member may include a step of forming a fourth adhesive layer having a thickness larger than that of the second wavelength conversion layer around the second wavelength conversion layer on the surface of the second intermediate layer, and a step of bonding the fourth adhesive layer with the second translucent member. FIG. 19 is a flowchart showing a method for producing a wavelength conversion member according to a seventh embodiment. The method for producing a wavelength conversion member according to the seventh embodiment preferably includes a step S701 of forming a first intermediate layer on the surface of a first translucent member, a step S702 of forming a first wavelength conversion layer on the surface of the first intermediate layer, a step S703 of forming a second intermediate layer on the surface of the first wavelength conversion layer, a step S704 of forming a second wavelength conversion layer on the surface of the second intermediate layer, a step S705 of forming a fourth adhesive layer having a thickness larger than that of the second wavelength conversion layer around the second wavelength conversion layer on the surface of the second intermediate layer, and a step S706 of bonding the fourth adhesive layer with the second translucent member.

Step of Forming Fourth Adhesive Layer

The second wavelength conversion layer formed on the surface of the second intermediate layer is preferably formed so as to have an area smaller than that of the second intermediate layer in order to form the fourth adhesive layer around the second wavelength conversion layer. The fourth adhesive layer is preferably formed by covering the second wavelength conversion layer formed on the second intermediate layer with a covering member, and then coating a fourth adhesive layer composition so as to have a thickness larger than that of the second wavelength conversion layer by a known method in the same manner as the first adhesive layer described above. After forming the fourth adhesive layer, it is preferable to remove the covering member. The fourth adhesive layer preferably uses a fourth adhesive layer composition containing the same resin as that of the first adhesive layer described above.

Light Emitting Device

The light emitting device includes the above-mentioned wavelength conversion member and an excitation light source. The wavelength conversion member may be any of the wavelength conversion members according to the first to eleventh embodiments described above.

Figure 20:
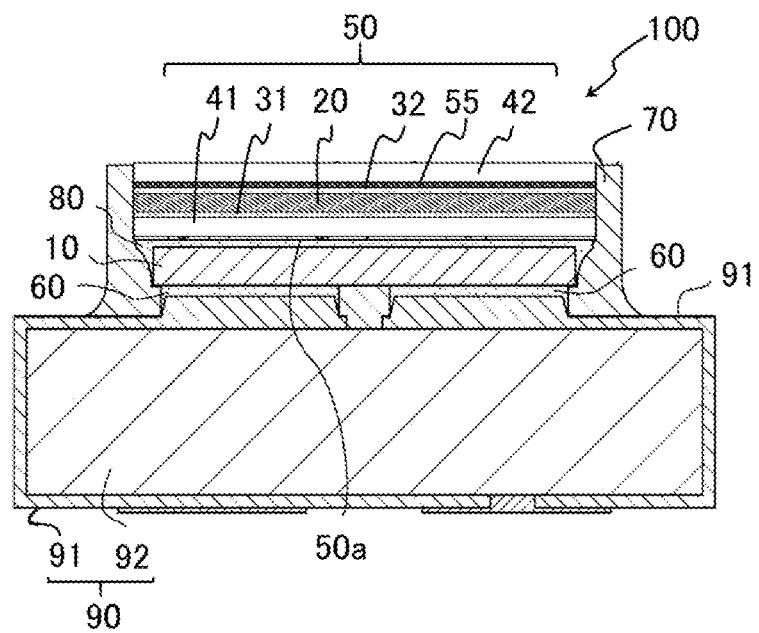
FIG. 20 is a schematic cross-sectional view of an exemplary light emitting device according to a first embodiment.
Figure 21:
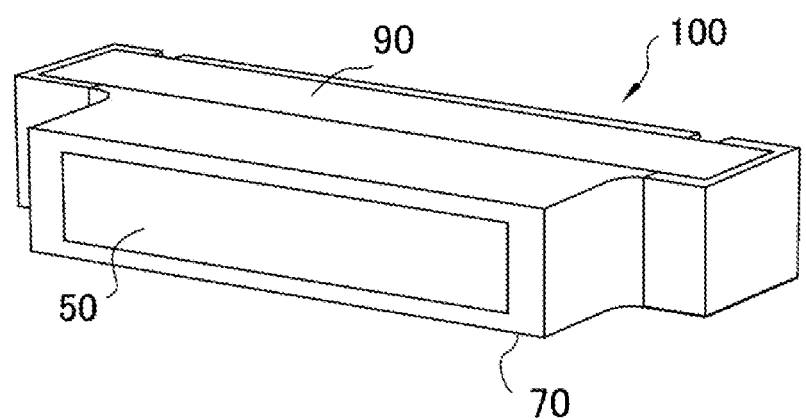
FIG. 21 is a schematic perspective view of the exemplary light emitting device according to the first embodiment.

The light emitting device will be described. FIG. 20 is a schematic cross-sectional view of a light emitting device according to a first embodiment. FIG. 21 is a schematic perspective view of the light emitting device according to the first embodiment.

The light emitting device 100 according to the first embodiment can be used in an image display device according to a first embodiment described later.

The light emitting device 100 includes a light emitting element 10 that serves as an excitation light source, and a wavelength conversion member 50 according to the second embodiment. The wavelength conversion member 50 includes a wavelength conversion layer 20 containing a fluorescent material having a perovskite-type structure and a composition of $ABX_3$, a first intermediate layer 31 and a first translucent member 41 on one surface of the wavelength conversion layer 20, and a second intermediate layer 32 and a second translucent member 42 on the other surface of the wavelength conversion layer 20. The light emitting element 10 is flip-chip mounted on a wiring 91 of a substrate 90 via a conductive member 60. The substrate 90 includes a wiring 91 and a base body 92 having the wiring 91. The wavelength conversion member 50 has a size that covers the entire surface of the light emitting element 10 in the front view. The wavelength conversion member 50 has a light incident surface 50*a* bonded to one surface of the light emitting element 10 via a light guide member 80. A covering member 70 is formed on the substrate 90, and covers the side surfaces of the conductive member 60, the light emitting element 10, the light guide member 80, and the wavelength conversion member 50, so as to surround the entire periphery of the conductive member 60, the light emitting element 10, the light guide member 80, and the wavelength conversion member 50. The front surface of the wavelength converting member 50 and the front surface of the covering member 70 constitute substantially the same surface.

The wavelength conversion member 50 according to the second embodiment includes a first intermediate layer 31 and a first translucent member 41, and a second intermediate layer 32 and a second translucent member 42, respectively, on both sides of the wavelength conversion layer 20, and also includes a first adhesive layer 55 interposed between the second intermediate layer 32 and the second translucent member 42. With this configuration, the wavelength conversion layer can be protected. Here, the light emitting device according to the first embodiment is described using an example of the wavelength conversion member 50 according to the second embodiment, but it may use the wavelength conversion member 50 according to the first embodiment. The wavelength conversion member 50 according to the first embodiment includes a first intermediate layer 30 and a translucent member 40 on one surface of a wavelength conversion layer 20.

Light Emitting Element

The light emitting element has at least a semiconductor element structure, and often includes a substrate. Examples of the light emitting element include an LED chip.

In the light emitting element, the light emission peak wavelength of the light emitting element can be selected from the ultraviolet region to the infrared region depending on the semiconductor material and its mixed crystal ratio. The semiconductor material preferably uses a nitride semiconductor capable of emitting short-wavelength light that can efficiently excite a fluorescent material. From the viewpoints of the light emission efficiency as well as the mixed color relationship between the excitation of the fluorescent material and the light emission, the light emission peak wavelength of the light emitting element is in a range of 380 nm or more and 500 nm or less, preferably in a range of 400 nm or more and 480 nm or less, and more preferably in a range of 420 nm or more and 475 nm or less.

Substrate

The substrate is constituted of at least a wiring and a base body that holds the wiring. In addition, the substrate may include an insulating protective film such as a solder resist or a cover lay.

Wiring

The wiring is formed on at least the top (front) surface of the base body, and may also be formed on the inside, and/or the side surface, and/or the bottom (back) surface of the base body. Also, the wiring preferably has an element connection terminal portion where the light emitting element is mounted, an external connection terminal portion that is connected to an external circuit, and a lead wiring portion that connects these terminal portions. The wiring can be constituted of copper, iron, nickel, tungsten, chromium, aluminum, silver, gold, titanium, palladium, rhodium, or alloys of these materials.

Base Body

When the substrate is a rigid substrate, the base body can be constituted by using a resin or a fiber-reinforced resin, ceramics, glass, metal, or paper. Examples of the resin or the fiber-reinforced resin include epoxy, glass epoxy, bismaleimide triazine, and polyimide.

Conductive Member

The conductive member can use at least one of; bumps of gold, silver, and copper; metal pastes containing metal powders of silver, gold, copper, platinum, aluminum, and palladium and a resin binder; tin-bismuth-based, tin-copper-based, tin-silver-based, and gold-tin-based solders; and brazing materials such as low melting point metal.

Light Guide Member

The light guide member is a member that bonds a light emitting element with a wavelength converting member, and guides light emitted from the light emitting element to the wavelength converting member. Examples of the matrix of the light guide member include a silicone resin, an epoxy resin, a phenol resin, a polycarbonate resin, an acrylic resin, and modified resins of these materials.

Covering Member

In the covering member, the light reflectance at the light emission peak wavelength of the light emitting element is preferably 70% or more, more preferably 80% or more, and even more preferably 90% or more, from the viewpoint of the forward light extraction efficiency.

Resin in Covering Member

Examples of the resin constituting the covering member include a silicone resin, an epoxy resin, a phenol resin, a polycarbonate resin, an acrylic resin, and modified resins of these materials.

White Pigment

As for white pigment, one type of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide can be used alone, or two or more types thereof can be used in combination.

Method for Producing Light Emitting Device

The light emitting device can be produced according to the method described in Japanese Unexamined Patent Publication No. 2017-188592.

Figure 22:
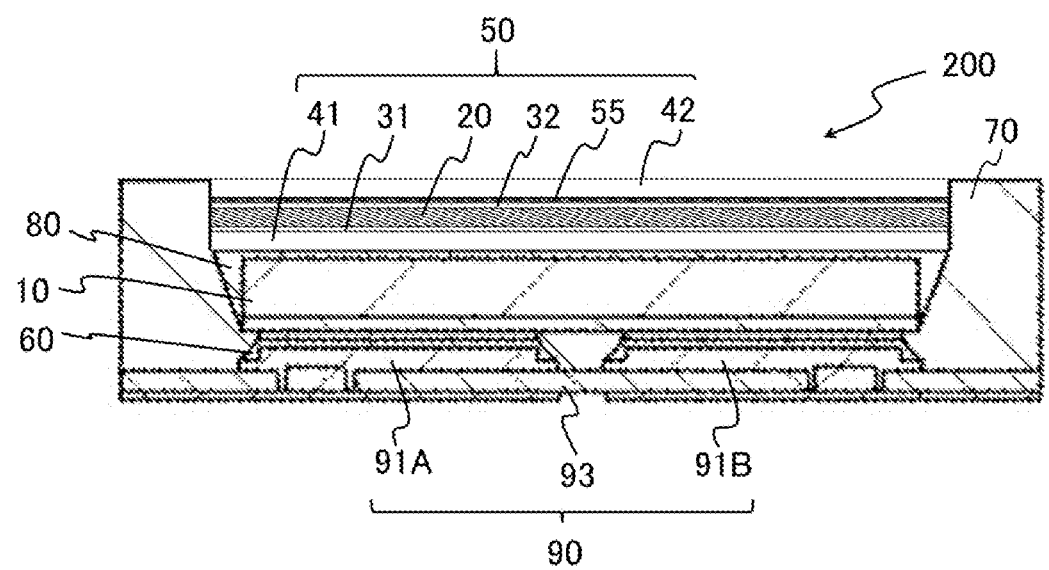
FIG. 22 is a schematic cross-sectional view of an exemplary light emitting device according to a second embodiment.
Figure 23:
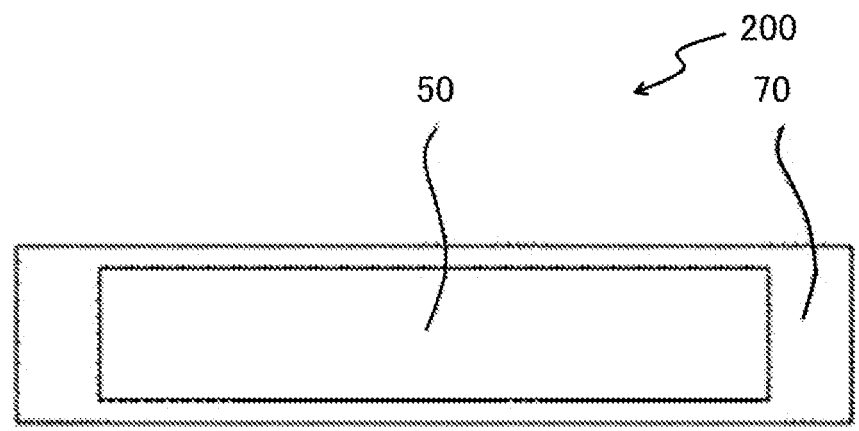
FIG. 23 is a schematic plan view of the exemplary light emitting device according to the second embodiment.

A light emitting device according to a second embodiment will be described. FIG. 22 is a schematic cross-sectional view of a light emitting device according to a second embodiment. FIG. 23 is a schematic plan view of the light emitting device according to the second embodiment.

The light emitting device 200 according to the second embodiment is a top-surface light emitting-type light emitting device. The top-surface light emitting-type light emitting device can be used in an image display device according to a second embodiment described later. In the light emitting device 200 according to the second embodiment, members common to the light emitting device 100 according to the first embodiment are given the same reference numerals. The light emitting device 200 according to the second embodiment uses a substrate 90 having a thin base material 93 of, for example, 500 μm or less and wirings 91A and 91B. A wavelength conversion member 50 includes a wavelength conversion layer 20 containing a fluorescent material having a perovskite-type structure and a composition of $ABX_3$, a first intermediate layer 31 and a first translucent member 41 on one surface of the wavelength conversion layer 20, and a second intermediate layer 32 and a second translucent member 42 on the other surface of the wavelength conversion layer 20. In the wavelength conversion member 50, a first adhesive layer 55 is interposed between the second intermediate layer 32 and the second translucent member 42. The wavelength converting member 50 has a light incident surface bonded to one surface of a light emitting element 10 via a light guide member 80. The light emitting device 200 includes a substrate 90 having a thin base material 93, and has other members common to the light emitting device 100.

The method for producing the light emitting device 200 is the same as the method for producing the light emitting device 100, and may include a step of removing a part of the base material 93 to make the base material thinner.

For example, a light emitting device used for a backlight can guide a wide range of light emission colors by using a light emitting element that emits blue light, a green fluorescent material that emits green light, and a red fluorescent material that emits red light.

Next, an image display device using the light emitting device according to the first embodiment or the light emitting device according to the second embodiment will be described.

Figure 24:
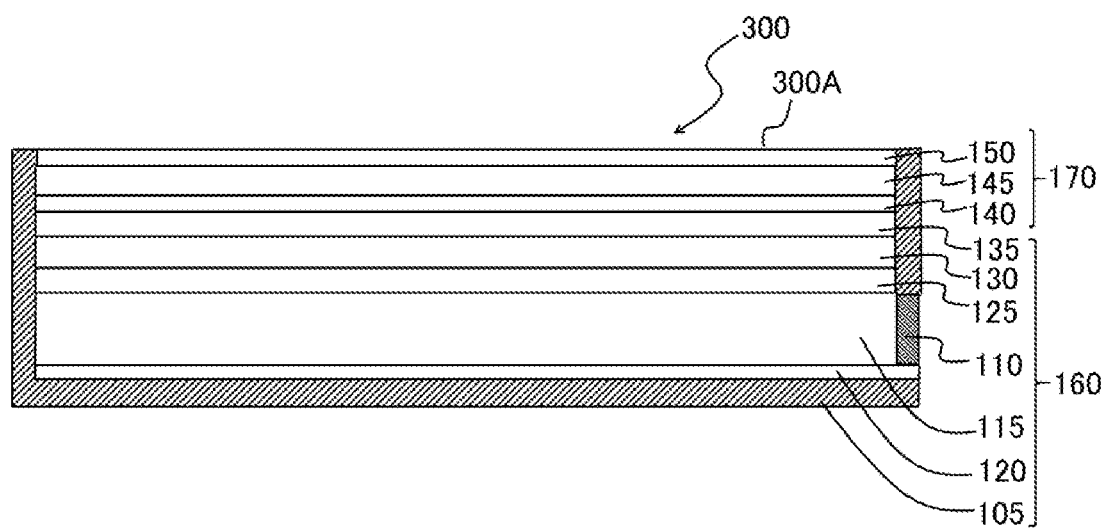
FIG. 24 is a schematic plan view of an exemplary image display device according to a first embodiment showing an edge light-type backlight structure.

FIG. 24 shows an image display device 300 according to a first embodiment. The image display device 300 according to the first embodiment includes a backlight device 160 and a display panel 170 arranged on the light emitting side of the backlight device 160. The image display device 300 has a display surface 300A that displays images. In the drawing, the surface of the display panel 170 is equal to the display surface 300A.

The backlight device 160 illuminates the display panel 170 in a plane shape from the back side.

Display Panel

The display panel 170 is a liquid crystal display panel, and includes a first polarizing sheet 140 arranged on the light incident side, a second polarizing sheet 150 arranged on the light emitting side, a liquid crystal cell 145 arranged between the first polarizing sheet 140 and the second polarizing sheet 150.

The details of the liquid crystal display panel are described in various publicly known documents (for example, "Flat Panel Display Dictionary" (supervised by Tatsuo Uchida and Heiju Uchiike)" published by Kogyo Chosakai in 2001), and further detailed explanation is thus omitted here.

Backlight Device

The backlight device 160 is configured as an edge light-type backlight device, and includes a housing 105, a light emitting device 110 arranged on or at a distance from the housing 105, a light guide plate 115 arranged on the side of the light emitting device 110, a diffusion sheet 125 arranged on the light emitting side of the light guide plate 115, a sheet-shaped second wavelength conversion member 130 arranged on the diffusion sheet, and a prism sheet 135 arranged on the light emitting surface side of the sheet-shaped wavelength conversion member 130. The backlight device 160 also includes a reflective sheet 120 between the housing 105 and the light guide plate 115.

The backlight device 160 has a light emitting surface that emits light in a plane shape. In the drawing, the light emitting surface of the prism sheet 135 is equal to the light emitting surface of the backlight device 160.

The surface of the sheet-shaped second wavelength conversion member 130 on the diffusion sheet 125 side is the light incident surface, and the surface of the sheet-shaped second wavelength conversion member 130 on the prism sheet 135 side is the light emitting surface. The sheet-shaped second wavelength conversion member 130 can use the same wavelength conversion member as those according to the first to eleventh embodiments described above, and can also use other wavelength conversion members.

Light Emitting Device

The light emitting device 110 is configured by using a large number of light emitting elements arranged linearly along one side of the side surfaces of the light guide plate 115, on the light incident surface side of the light guide plate 115. The light emitting device 110 can use the light emitting device according to the first embodiment or the light emitting device according to the second embodiment described above. A light emitting device having no wavelength conversion member may be additionally included.

Light Guide Plate

The light guide plate 115 has a light emitting surface composed of one main surface on the display panel 170 side, a back surface composed of the other main surface facing the light emitting surface, and side surfaces extending between the light emitting surface and the back surface. Of these side surfaces, the side surface on the light emitting device 110 side is the light incident surface that receives light from the light emitting device 110. The light incident on the light guide plate 115 from the light incident surface is guided through the optical plate in the direction connecting the light incident surface and the opposite surface facing the light incident surface, and is emitted from the light emitting surface.

As the material constituting the light guide plate 115, for example, transparent resins mainly containing one or more of acrylic resin, polystyrene, polycarbonate, polyethylene terephthalate, and polyacrylonitrile, and epoxy acrylate-based and urethane acrylate-based reactive resins (ionizing radiation curable resins) can be suitably used.

Diffusion Sheet

The diffusion sheet 125 has a function of diffusing the light emitted from the light emitting surface of the light guide plate 115 and uniformly entering the light into the sheet-shaped second wavelength conversion member 130. The diffusion sheet 125 uses a resin containing light diffusing materials.

Prism Sheet

The prism sheet 135 has a function of increasing the brightness of the light emitted from the sheet-shaped second wavelength conversion member 130.

Reflective Sheet

The reflective sheet 120 allows the light emitted from the light emitting device 110 to enter the light guide plate 115 and to be emitted from the light emitting surface side.

Thus, the light emitted from the backlight device 160 enters the first polarizing sheet 140 arranged on the display panel 170 and is emitted from the display surface 300A of the image display device.

Figure 25:
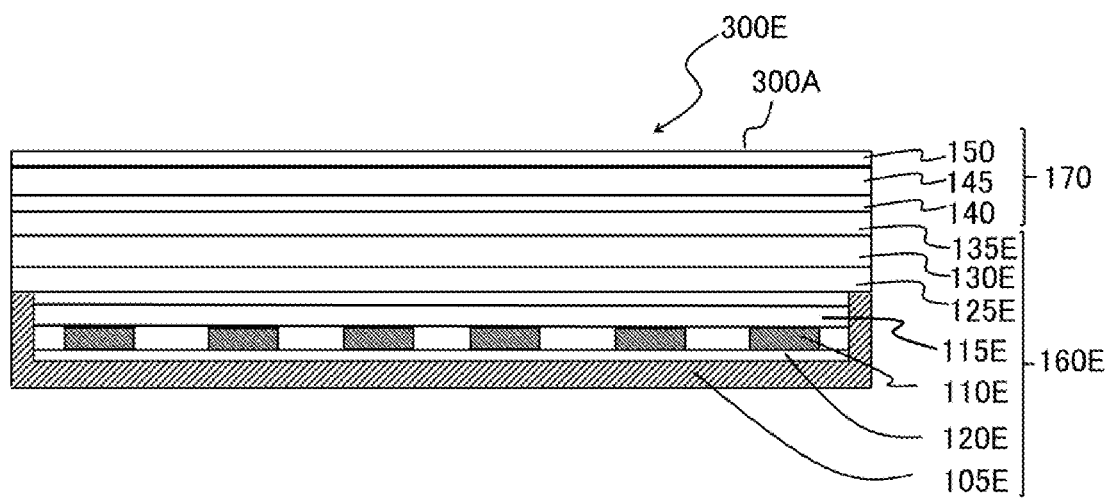
FIG. 25 is a schematic cross-sectional view of an exemplary image display device according to a second embodiment showing a direct-type backlight structure.

Next, an image display device according to a second embodiment will be described with reference to the drawing. FIG. 25 is a schematic cross-sectional view of an image display device according to a second embodiment showing a direct-type backlight structure.

The image display device 300E according to the second embodiment includes a backlight device 160E, and a display panel 170 arranged on the light emitting side of the backlight device 160E that has the same configuration as the display panel 170 described in the image display device according to the first embodiment.

The backlight device 160E is configured as a direct-type backlight device, and includes a light emitting device 110E, a housing 105E in which the light emitting device 110E is arranged, a diffusion sheet 125E arranged at a distance from the light emitting device 110E, a sheet-shaped second wavelength conversion member 130E arranged on the diffusion sheet, and a prism sheet 135E arranged on the light emitting side of the sheet-shaped wavelength conversion member 130E. The light emitting device 110E can use the light emitting device according to the first embodiment or the light emitting device according to the second embodiment described above. The backlight device 160E also includes a reflective sheet 120E between the housing 105E and a light guide plate 115E.

Reflective Sheet

The reflective sheet 120E allows the light emitted from the light emitting device 110E to enter the diffusion sheet 125E through the light guide plate 115E.

Thus, the light emitted from the backlight device 160E enters the first polarizing sheet 140 arranged on the display panel 170 and is emitted from the display surface 300A of the image display device.

EXAMPLES

The present disclosure is hereunder specifically described by reference to the following Examples. The present disclosure is not limited to these Examples.

Example 1

The wavelength conversion member according to the first embodiment was formed (see FIG. 1).

A single-layered first translucent member composed of polyethylene terephthalate was prepared. The thickness of the first translucent member was 120 μm.

Using silicon dioxide ($SiO_2$) as a raw material, a first intermediate layer having a thickness of 100 nm composed of silicon dioxide ($SiO_2$) was formed by the sputtering method using a magnetron sputtering apparatus in an argon atmosphere at room temperature.

Using cesium bromide (CsBr) and lead bromide (PbBr$_2$) as raw materials for the fluorescent material, physical vapor deposition was performed using a vapor deposition apparatus at room temperature such that the vapor deposition ratio was in the range of 1:1 or more and 10:1 or less, to thereby form a wavelength conversion layer containing 99% by mass or more of cesium-lead bromide. The cesium-lead bromide was a fluorescent material capable of emitting light when irradiated with excitation light in the wavelength range from ultraviolet light to visible light. It is confirmed that the cesium-lead bromide contained in the wavelength conversion layer contained a fluorescent material capable of emitting light when irradiated with visible light and having a perovskite-type structure and a composition represented by CsPbBr$_3$. Specifically, the wavelength conversion layer contained the cesium-lead bromide that was a fluorescent material capable of emitting light when irradiated with excitation light having a light emission peak wavelength of 450 nm. Another wavelength conversion layer that was vapor-deposited under the same conditions was subjected to compositional analysis using an energy dispersive X-ray spectrometer (EDX, manufactured by Oxford Instruments, acceleration voltage: 10 kV). It is confirmed that, in the fluorescent materials, the fluorescent material having a composition represented by CsPbBr$_3$ was approximately 10% by mass, and the fluorescent material having a composition represented by Cs$_4$PbBr$_6$ was approximately 90% by mass.

Comparative Example 1

A wavelength conversion member of Comparative Example 1 with no first intermediate layer was formed in the same manner as in Example 1, except that the wavelength conversion layer was formed on the surface of the first translucent member without forming the first intermediate layer.

Comparative Example 2

A wavelength conversion member of Comparative Example 2 with no first intermediate layer was formed in the same manner as in Example 1, except that a first translucent member in which a plurality of layers including a gas barrier layer and a layer composed of polyethylene terephthalate were laminated, was used, and the wavelength conversion layer was formed on the surface of the first translucent member without forming the first intermediate layer.

The wavelength conversion members according to Example and Comparative Examples were evaluated as follows.

Each of the wavelength conversion members according to Example and Comparative Examples was stored in a furnace at 80° C. for 100 hours. The light emission spectra of each wavelength conversion member before being placed in the furnace and after being stored in the furnace at 80° C. for 100 hours were measured using an illuminance spectrophotometer (CL-500A, manufactured by Konica Minolta, Inc.).

The light emission intensity of the light emission peak of each wavelength conversion member before being placed in the furnace was set at 100%, and the rate of decrease in the light emission intensity of the light emission peak of each wavelength conversion member after being stored in the furnace at 80° C. for 100 hours was calculated. The results are shown in Table 1.

TABLE 1

| | Rate of decrease in light emission intensity (%) after being stored at 80° C. for 100 hours |
|---|---|
| Example 1 | 14 |
| Comparative Example 1 | 23 |
| Comparative Example 2 | 37 |

In the wavelength conversion member according to Example 1, the light emission intensity of the light emission peak of the wavelength conversion member after being stored in the furnace at 80° C. for 100 hours decreased by 14%, compared to 100% of the light emission intensity of the light emission peak of the wavelength conversion member before being placed in the furnace. Since the wavelength conversion member according to Example 1 had the first intermediate layer between the translucent member containing a resin and the wavelength conversion layer, the reaction between the fluorescent material having a perovskite-type structure and a composition of ABX$_3$ contained in the wavelength conversion layer and the resin contained in the translucent member was suppressed, and the decrease in the light emission intensity of the fluorescent material having a perovskite-type structure and a composition of ABX$_3$ contained in the wavelength conversion layer was suppressed.

In the wavelength conversion member according to Comparative Example 1, the light emission intensity of the light emission peak of the wavelength conversion member after being stored in the furnace at 80° C. for 100 hours decreased by 23%, compared to 100% of the light emission intensity of the light emission peak of the wavelength conversion member before being placed in the furnace. It is presumed that since the wavelength conversion member according to Comparative Example 1 had no first intermediate layer between the translucent member containing a resin and the wavelength conversion layer, the fluorescent material having a perovskite-type structure and a composition of ABX$_3$ contained in the wavelength conversion layer reacted with the resin contained in the translucent member by heating at 80° C. for 100 hours, resulting in that the crystal structure of the fluorescent material contained in the wavelength conversion layer was changed, and thus the light emission intensity decreased.

In the wavelength conversion member according to Comparative Example 2, the light emission intensity of the light emission peak of the wavelength conversion member after being stored in the furnace at 80° C. for 100 hours decreased by 37%, compared to 100% of the light emission intensity of the light emission peak of the wavelength conversion member before being placed in the furnace. It is presumed that since the wavelength conversion member according to Comparative Example 2 had no first intermediate layer between the translucent member containing a resin and the wavelength conversion layer, the fluorescent material having a perovskite-type structure and a composition of ABX$_3$ contained in the wavelength conversion layer reacted with the resin contained in the translucent member by heating at 80° C. for 100 hours even when the first translucent member had a plurality of laminated structures including a gas barrier layer, resulting in that the crystal structure of the fluorescent material contained in the wavelength conversion layer was changed, and thus the light emission intensity decreased.

The embodiments of the present disclosure are useful for various illumination light sources, automotive light sources, and display light sources. In particular, they can be advantageously applied to backlight units for image display devices using liquid crystals. The light emitting devices according to the embodiments of the present disclosure are also useful for backlighting for display devices of mobile devices. They can be used as light emitting devices for general lighting and for vehicles.

The invention claimed is:

1. A wavelength conversion member, comprising a translucent member containing a resin, a wavelength conversion layer obtained by a vapor deposition method, containing no resin and containing a first fluorescent material having a composition of $ABX_3$, and a first intermediate layer containing a transparent inorganic oxide provided between the translucent member and the wavelength conversion layer,
   wherein in $ABX_3$, A represents at least one cation selected from the group consisting of $Rb^+$, $CH_3NH_3^+$, and $Cs^+$, B represents at least one metal ion selected from the group consisting of $Pb^{2+}$ and $Sn^{2+}$, and X represents at least one anion selected from the group consisting of $F^-$, $Cl^-$, $Br^-$, and $I^-$,
   wherein the first fluorescent material consists of a complex containing a cesium-lead halide,
   wherein the cesium-lead halide comprises a first cesium-lead halide having a composition represented by $CsPbBr_3$, and a second cesium-lead halide having a composition represented by $Cs_4PbBr_6$, and
   wherein the first fluorescent material comprises 1% by mass or more and 50% by mass or less of the first cesium-lead halide having a composition represented by $CsPbBr_3$ relative to a total amount of the first fluorescent material.

2. The wavelength conversion member according to claim 1, wherein the wavelength conversion layer comprises 99% by mass or more of the cesium-lead halide.

3. The wavelength conversion member according to claim 1, wherein the first intermediate layer comprises at least one oxide selected from the group consisting of silicon dioxide, aluminum oxide, zirconium oxide, magnesium oxide, titanium oxide, cerium oxide, zinc oxide, and tin oxide.

4. The wavelength conversion member according to claim 1, wherein the wavelength conversion layer has a thickness in a range of 10 nm or more and 10 μm or less.

5. The wavelength conversion member according to claim 1, wherein a ratio of a thickness of the first intermediate layer to a thickness of the wavelength conversion layer is in a range of 0.001 or more and 1,000 or less.

6. The wavelength conversion member according to claim 1,
   wherein the translucent member comprises a layered first translucent member and a layered second translucent member,
   wherein the wavelength conversion layer is arranged between the first translucent member and the second translucent member, and
   wherein the wavelength conversion member comprises a second intermediate layer arranged on a surface of the wavelength conversion layer on a side of the second translucent member.

7. The wavelength conversion member according to claim 6, wherein the first translucent member or the second translucent member has a thickness in a range of 5 μm or more and 500 μm or less.

8. The wavelength conversion member according to claim 1,
   wherein the translucent member comprises a layered first translucent member and a layered second translucent member,
   wherein the wavelength conversion layer is arranged between the first translucent member and the second translucent member, and
   wherein the wavelength conversion member comprises a second adhesive layer that is arranged around the wavelength conversion layer and has a thickness larger than a thickness of the wavelength conversion layer such that the wavelength conversion layer does not come into contact with the second translucent member.

9. The wavelength conversion member according to claim 1,
   wherein the translucent member comprises a layered first translucent member and a layered second translucent member,
   wherein the wavelength conversion layer comprises a first wavelength conversion layer containing the first fluorescent material and a second wavelength conversion layer containing a second fluorescent material having a light emission peak wavelength in a wavelength range different from that of the first fluorescent material,
   wherein the first wavelength conversion layer and the second wavelength conversion layer are arranged between the first translucent member and the second translucent member, and
   wherein the wavelength conversion member comprises a second intermediate layer arranged on a surface of the first wavelength conversion layer on a side of the second translucent member, between the first wavelength conversion layer and the second wavelength conversion layer, and a third intermediate layer arranged on a surface of the second wavelength conversion layer on the side of the second translucent member.

10. The wavelength conversion member according to claim 9, wherein the second fluorescent material comprises a cesium-lead halide having a composition represented by $CsPb(Br_{1-x}I_x)_3$ (0≤x<1.0), and/or a cesium-lead halide having a composition represented by $Cs_4Pb(Br_{1-x}I_x)_6$ (0≤x<1.0).

11. The wavelength conversion member according to claim 10, wherein the second fluorescent material comprises 1% by mass or more and 50% by mass or less of the cesium-lead halide having a composition represented by $CsPb(Br_{1-x}I_x)_3$ (0≤x<1.0) relative to the total amount of the second fluorescent material.

12. The wavelength conversion member according to claim 1,
   wherein the translucent member comprises a layered first translucent member and a layered second translucent member,
   wherein the wavelength conversion layer comprises a first wavelength conversion layer containing the first fluorescent material and a second wavelength conversion layer containing a second fluorescent material having a light emission peak wavelength in a wavelength range different from that of the first fluorescent material,
   wherein the first wavelength conversion layer and the second wavelength conversion layer are arranged between the first translucent member and the second translucent member, and
   wherein the wavelength conversion member comprises a second intermediate layer arranged on a surface of the first wavelength conversion layer on a side of the second translucent member, between the first wavelength conversion layer and the second wavelength conversion layer, and a fourth adhesive layer that is arranged around the second wavelength conversion layer and has a thickness larger than a thickness of the second wavelength conversion layer such that the second wavelength conversion layer does not come into contact with the second translucent member.

13. The wavelength conversion member according to claim 12, wherein the second fluorescent material comprises a cesium-lead halide having a composition represented by $CsPb(Br_{1-x}I_x)_3$ ($0 \leq x < 1.0$), and/or a cesium-lead halide having a composition represented by $Cs_4Pb(Br_{1-x}I_x)_6$ ($0 \leq x < 1.0$).

14. The wavelength conversion member according to claim 13, wherein the second fluorescent material comprises 1% by mass or more and 50% by mass or less of the cesium-lead halide having a composition represented by $CsPb(Br_{1-x}I_x)_3$ ($0 \leq x < 1.0$) relative to the total amount of the second fluorescent material.

15. A light emitting device, comprising the wavelength conversion member according to claim 1 and an excitation light source.

16. The wavelength conversion member according to claim 1, wherein the first fluorescent material has a perovskite-type structure.

* * * * *